US012666642B2

(12) United States Patent
Harrington, III et al.

(10) Patent No.: US 12,666,642 B2
(45) Date of Patent: Jun. 23, 2026

(54) MULTIPLE SILICIDE PROCESS FOR SEPARATELY FORMING N-TYPE AND P-TYPE OHMIC CONTACTS AND RELATED DEVICES

(71) Applicant: Wolfspeed, Inc., Durham, NC (US)

(72) Inventors: Thomas E. Harrington, III, Durham, NC (US); Shadi Sabri, Apex, NC (US)

(73) Assignee: Wolfspeed, Inc., Durham, NC (US)

( * ) Notice: Subject to any disclaimer, the term of this patent is extended or adjusted under 35 U.S.C. 154(b) by 662 days.

(21) Appl. No.: 17/505,744

(22) Filed: Oct. 20, 2021

(65) Prior Publication Data

US 2023/0124215 A1 Apr. 20, 2023

(51) Int. Cl.
| | |
|---|---|
| *H10D 30/65* | (2025.01) |
| *H10D 30/01* | (2025.01) |
| *H10D 62/832* | (2025.01) |
| *H10D 64/62* | (2025.01) |

(52) U.S. Cl.
CPC ......... *H10D 30/65* (2025.01); *H10D 30/0281* (2025.01); *H10D 62/8325* (2025.01); *H10D 64/62* (2025.01)

(58) Field of Classification Search
CPC . H01L 29/7816; H01L 29/1608; H01L 29/45; H01L 29/66681
See application file for complete search history.

(56) References Cited

U.S. PATENT DOCUMENTS

| | | | | |
|---|---|---|---|---|
| 11,469,348 B1* | 10/2022 | Shealy | ............... | H01L 33/007 |
| 2008/0179602 A1* | 7/2008 | Negley | ............... | H01L 27/156 |
| | | | | 438/34 |
| 2009/0256151 A1* | 10/2009 | Huh | ............... | H01L 29/66765 |
| | | | | 257/288 |
| 2014/0367771 A1* | 12/2014 | Chatty | ............. | H01L 29/66719 |
| | | | | 257/329 |
| 2020/0027968 A1 | 1/2020 | Tang et al. | | |
| 2021/0305464 A1* | 9/2021 | Herner | ............... | H01L 27/15 |
| 2022/0293593 A1 | 9/2022 | Qiaoming et al. | | |

OTHER PUBLICATIONS

Matin et al. "A Self-Aligned Process for High-Voltage, Short-Channel Vertical DMOSFETs in 4H-SiC" IEEE Transactions on Electron Devices 51(10):1721-1725 (Oct. 2004).

* cited by examiner

*Primary Examiner* — Timor Karimy
(74) *Attorney, Agent, or Firm* — Myers Bigel, P.A.

(57) ABSTRACT
A power semiconductor device includes a semiconductor layer structure comprising a wide bandgap semiconductor material. The semiconductor layer structure includes a drift region of a first conductivity type, a source region of the first conductivity type, and a well contact region of a second conductivity type adjacent the source region. A first ohmic contact comprising a first conductive material is formed on the source region. A second ohmic contact comprising a second conductive material, which is different than the first conductive material, is formed on the well contact region. A gate structure is formed on the drift region and includes a gate contact comprising a third conductive material, which is different than the first and second conductive material. Related devices and fabrication methods are also discussed.

28 Claims, 15 Drawing Sheets

MULTIPLE SILICIDE PROCESS FOR SEPARATELY FORMING N-TYPE AND P-TYPE OHMIC CONTACTS AND RELATED DEVICES

FIELD

The present invention relates to semiconductor devices and, more particularly, to power semiconductor devices.

BACKGROUND

Power semiconductor devices are used to carry large currents and support high voltages. A wide variety of power semiconductor devices are known in the art including, for example, power Metal Insulator Semiconductor Field Effect Transistors ("MISFETs", including Metal Oxide Semiconductor FETs ("MOSFETs")), bipolar junction transistors ("BJTs"), Insulated Gate Bipolar Transistors ("IGBT"), Junction Barrier Schottky diodes, Gate Turn-Off Transistors ("GTO"), MOS-controlled thyristors, and various other devices. These power semiconductor devices are generally fabricated from wide bandgap semiconductor materials, for example, silicon carbide ("SiC") or Group III nitride (e.g., gallium nitride ("GaN"))-based semiconductor materials. Herein, a wide bandgap semiconductor material refers to a semiconductor material having a bandgap greater than about 1.40 eV, for example, greater than about 2 eV.

A conventional power semiconductor device typically has a semiconductor substrate having a first conductivity type (e.g., a n-type substrate) on which an epitaxial layer structure having the first conductivity type (e.g., n-type) is formed. A portion of this epitaxial layer structure (which may comprise one or more separate layers) functions as a drift layer or drift region of the power semiconductor device. The device typically includes an "active region," which includes one or more "unit cell" structures that have a junction, for example, a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices.

Power semiconductor devices may have a unit cell configuration in which a large number of individual unit cell structures of the active region are electrically connected in parallel to function as a single power semiconductor device. In high power applications, such a power semiconductor device may include thousands or tens of thousands of unit cells implemented in a single chip or "die." A die or chip may include a small block of semiconducting material or other substrate in which electronic circuit elements are fabricated.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. As the applied voltage approaches or passes the voltage level that the device is designed to block, non-trivial levels of current (referred to as leakage current) may begin to flow through the power semiconductor device. The blocking capability of the device may be a function of, among other things, the doping density/concentration and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable runaway generation of charge carriers within the semiconductor device, leading to a condition known as avalanche breakdown.

Power semiconductor devices can have a lateral structure or a vertical structure. In a device having a lateral structure, the terminals of the device (e.g., the drain, gate and source terminals for a power MOSFET device) are on the same major surface (e.g., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more layers, for example, semiconductor substrates and/or semiconductor epitaxial layers. In SiC-based power devices, a same silicide metal (or metals) and a same silicide anneal scheme may typically be used to form contacts to the terminals of the device.

SUMMARY

According to some embodiments, a power semiconductor device comprises a semiconductor layer structure. The semiconductor layer structure comprises a drift region of a first conductivity type, a source region of the first conductivity type, and a well contact region of a second conductivity type. A first ohmic contact comprising a first conductive material is provided on the source region, and a second ohmic contact comprising a second conductive material is provided on the well contact region, where the second conductive material is different than the first conductive material. A gate structure comprises a gate contact comprising a third conductive material, where the third conductive material is different than the first and second conductive materials.

In some embodiments, a dielectric layer is provided on a surface of the semiconductor layer structure, and the dielectric layer laterally extends onto an edge of the first ohmic contact.

In some embodiments, a surface of the well contact region comprises a step difference relative to a surface of the source region. The step difference may be greater than about 10 nanometers (nm) and less than about 100 nm.

In some embodiments, a first contact resistance of the first ohmic contact and a second contact resistance of the second ohmic contact are less than about $1\times10^{-3}$ ohm-cm$^2$. The first contact resistance may be about $1\times10^{-6}$ ohm-cm$^2$ to about $5\times10^{-7}$ ohm-cm$^2$, and the second contact resistance may be about $1\times10^{-4}$ ohm-cm$^2$ to about $5\times10^{-7}$ ohm-cm$^2$.

In some embodiments, the semiconductor layer structure comprises silicon carbide, and the first, second, and third conductive materials comprise first, second, and third metal silicides, respectively.

In some embodiments, the first conductive silicide comprises nickel, the second conductive silicide comprises at least one of nickel, aluminum, or titanium, and the third conductive silicide comprises at least one of tantalum, tungsten, titanium, or cobalt.

In some embodiments, the first and second ohmic contacts comprise at least one dimension that is about 2 micrometers (μm) to about 1 μm.

According to some embodiments, a power semiconductor device, comprises a semiconductor layer structure comprising a drift region of a first conductivity type, a source region of the first conductivity type, and a well contact region of a second conductivity type adjacent the source region; a first ohmic contact comprising a first conductive material on the source region; and a second ohmic contact comprising a second conductive material on the well contact region. The second conductive material is different than the first conductive material. The first and second ohmic contacts comprise at least one dimension that is less than about 2 micrometers (μm).

In some embodiments, a gate structure is provided on the drift region adjacent the source region, a protective spacer is provided on a sidewall of the gate structure, and a gate contact is provided on the gate structure. The gate contact comprises a third metal silicide that is different from the first and second metal silicides.

In some embodiments, the first metal silicide comprises nickel, the second metal silicide comprises at least one of nickel, aluminum, or titanium, and the third metal silicide comprises at least one of tantalum, tungsten, titanium, or cobalt.

In some embodiments, a dielectric layer is provided on a surface of the semiconductor layer structure, and the dielectric layer laterally extends onto an edge of the first ohmic contact.

In some embodiments, a surface of the well contact region having the second ohmic contact thereon comprises a step difference relative to a surface of the source region having the first ohmic contact thereon. The step difference may be greater than about 10 nanometers (nm) and less than about 100 nm.

In some embodiments, a first contact resistance of the first ohmic contact and a second contact resistance of the second ohmic contact are less than about $1\times10^{-3}$ ohm-cm$^2$ and greater than about $5\times10^{-7}$ ohm-cm$^2$.

In some embodiments, the at least one dimension of the first and second contacts is greater than about 1 μm.

According to some embodiments, a power semiconductor device comprises a semiconductor layer structure comprising a drift region of a first conductivity type, a source region of the first conductivity type, and a well contact region of a second conductivity type adjacent the source region; a first ohmic contact comprising a first conductive material on the source region; a second ohmic contact comprising a second conductive material on the well contact region, where the second conductive material is different than the first conductive material; and a dielectric layer on a surface of the semiconductor layer structure. The dielectric layer laterally extends onto an edge of the first ohmic contact.

In some embodiments, the semiconductor layer structure comprises silicon carbide, and wherein the first and second conductive materials comprise first and second metal silicides, respectively.

In some embodiments, a gate structure is provided on the drift region adjacent the source region, and a gate contact is provided on the gate structure, where the gate contact comprises a third metal silicide that is different from the first and second metal silicides. The third metal silicide may have a lower silicidation temperature than the first metal silicide.

In some embodiments, the first metal silicide comprises nickel, the second metal silicide comprises at least one of nickel, aluminum, or titanium, and the third metal silicide comprises at least one of titanium or cobalt.

In some embodiments, a first contact resistance of the first ohmic contact and a second contact resistance of the second ohmic contact are less than about $1\times10^{-3}$ ohm-cm$^2$ and greater than about $5\times10^{-7}$ ohm-cm$^2$.

In some embodiments, the first and second ohmic contacts comprise at least one dimension that is about 2 micrometers (μm) to about 1 μm.

According to some embodiments, a power semiconductor device comprises a semiconductor layer structure comprising a drift region of a first conductivity type, a source region of the first conductivity type, and a well contact region of a second conductivity type adjacent the source region; a first ohmic contact comprising a first conductive material on the source region; and a second ohmic contact comprising a second conductive material on the well contact region. A surface of the well contact region comprises a step difference relative to a surface of the source region.

In some embodiments, the semiconductor layer structure comprises silicon carbide, and wherein the first and second conductive materials are different and comprise first and second metal silicides, respectively.

In some embodiments, a gate structure is provided on the drift region adjacent the source region, and a gate contact is provided on the gate structure. The gate contact comprises a third metal silicide that is different from the first and second metal silicides. The third metal silicide may have a higher silicidation temperature than the first or second metal silicide.

In some embodiments, the first metal silicide comprises nickel, the second metal silicide comprises at least one of nickel, aluminum, or titanium, and the third metal silicide comprises at least one of tantalum or tungsten.

In some embodiments, the step difference is greater than about 10 nanometers (nm) and less than about 100 nm.

In some embodiments, a first contact resistance of the first ohmic contact and a second contact resistance of the second ohmic contact are less than about $1\times10^{-3}$ ohm-cm$^2$ and greater than about $5\times10^{-7}$ ohm-cm$^2$.

According to some embodiments, a method of fabricating a semiconductor device comprises providing a semiconductor layer structure comprising a drift region of a first conductivity type, a source region of the first conductivity type, and a well contact region of a second conductivity type adjacent the source region; forming a first ohmic contact comprising a first conductive material on the source region; forming a second ohmic contact comprising a second conductive material on the well contact region, wherein the second conductive material is different than the first conductive material; and forming a dielectric layer on a surface of the semiconductor layer structure after forming the first and second ohmic contacts and prior to forming one or more metal contact layers.

In some embodiments, the semiconductor layer structure comprises silicon carbide, and wherein the first and second conductive materials comprise first and second metal silicides, respectively.

In some embodiments, the dielectric layer laterally extends onto an edge of the first ohmic contact.

In some embodiments, the second ohmic contact is formed after the first ohmic contact, the first metal silicide is formed at a first temperature, and the second metal silicide is formed at a second temperature that is lower than the first temperature.

In some embodiments, a first contact resistance of the first ohmic contact and a second contact resistance of the second ohmic contact are less than about $1\times10^{-3}$ ohm-cm$^2$.

In some embodiments, a gate structure is formed on the drift region adjacent the source region, and a gate contact is formed on the gate structure, where the gate contact comprises a third metal silicide that is different from the first and second metal silicides.

In some embodiments, the gate contact is formed after the first contact and before the second contact, and the third metal silicide is formed at a third temperature that is lower than the first temperature and is higher than the second temperature.

In some embodiments, the first metal silicide comprises nickel, the second metal silicide comprises at least one of nickel, aluminum, or titanium, and the third metal silicide comprises at least one of titanium or cobalt.

In some embodiments, the first and second ohmic contacts comprise at least one dimension that is about 2 micrometers (μm) to about 1 μm.

According to some embodiments, a method of fabricating a semiconductor device comprises providing a semiconductor layer structure comprising a drift region of a first conductivity type, a source region of the first conductivity type, and a well contact region of a second conductivity type adjacent the source region; forming a dielectric layer on a surface of the semiconductor layer structure; and after forming the dielectric layer, sequentially forming a first ohmic contact comprising a first conductive material on the source region and a second ohmic contact comprising a second conductive material on the well contact region.

In some embodiments, the semiconductor layer structure comprises silicon carbide, and the first and second conductive materials are different and comprise first and second metal silicides, respectively.

In some embodiments, the first metal silicide is formed at a first temperature, and the second metal silicide is formed at a second temperature that is lower than the first temperature.

In some embodiments, a first contact resistance of the first ohmic contact and a second contact resistance of the second ohmic contact are less than about $1\times10^{-3}$ ohm-cm$^2$ and greater than about $5\times10^{-7}$ ohm-cm$^2$.

In some embodiments, a surface of the well contact region having the second ohmic contact thereon comprises a step difference relative to a surface of the source region having the first ohmic contact thereon.

In some embodiments, a blocking region is formed on the well contact region before forming the dielectric layer, and the blocking region is removed to form the step difference before forming the second ohmic contact.

In some embodiments, a gate structure is formed on the drift region adjacent the source region, and a gate contact is formed on the gate structure, where the gate contact comprises a third metal silicide that is different from the first and second metal silicides.

In some embodiments, the gate contact is formed after the dielectric layer, and the third metal silicide is formed at a third temperature that is greater than the first or second temperature.

In some embodiments, the first metal silicide comprises nickel, the second metal silicide comprises at least one of nickel, aluminum, or titanium, and the third metal silicide comprises at least one of tantalum or tungsten.

In some embodiments, the step difference is greater than about 10 nanometers (nm) and less than about 100 nm.

According to some embodiments, a power semiconductor device comprises a semiconductor layer structure comprising a drift region of a first conductivity type, a source region of the first conductivity type, and a well contact region of a second conductivity type adjacent the source region; a first ohmic contact comprising a first conductive material on the source region; and a second ohmic contact comprising a second conductive material on the well contact region, wherein the second conductive material is different than the first conductive material. A first contact resistance of the first ohmic contact and a second contact resistance of the second ohmic contact are less than about $1\times10^{-3}$ ohm-cm$^2$.

In some embodiments, the first contact resistance is about $1\times10^{-6}$ ohm-cm$^2$ to about $5\times10^{-7}$ ohm-cm$^2$, and the second contact resistance is about $1\times10^{-4}$ ohm-cm$^2$ to about $5\times10^{-7}$ ohm-cm$^2$.

In some embodiments, the semiconductor layer structure comprises silicon carbide, and wherein the first and second conductive materials comprise first and second metal silicides, respectively.

In some embodiments, a gate structure is provided on the drift region adjacent the source region, and a gate contact is provided on the gate structure. The gate contact comprises a third metal silicide that is different from the first and second metal silicides, and the gate contact has a third contact resistance of about $1\times10^{-3}$ ohm-cm$^2$ to about $5\times10^{-7}$ ohm-cm$^2$.

In some embodiments, the first and second ohmic contacts comprise at least one dimension that is about 2 micrometers (μm) to about 1 μm.

In any embodiments, the semiconductor layer structure may include a wide bandgap semiconductor material.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION OF EMBODIMENTS

Figure 1A:
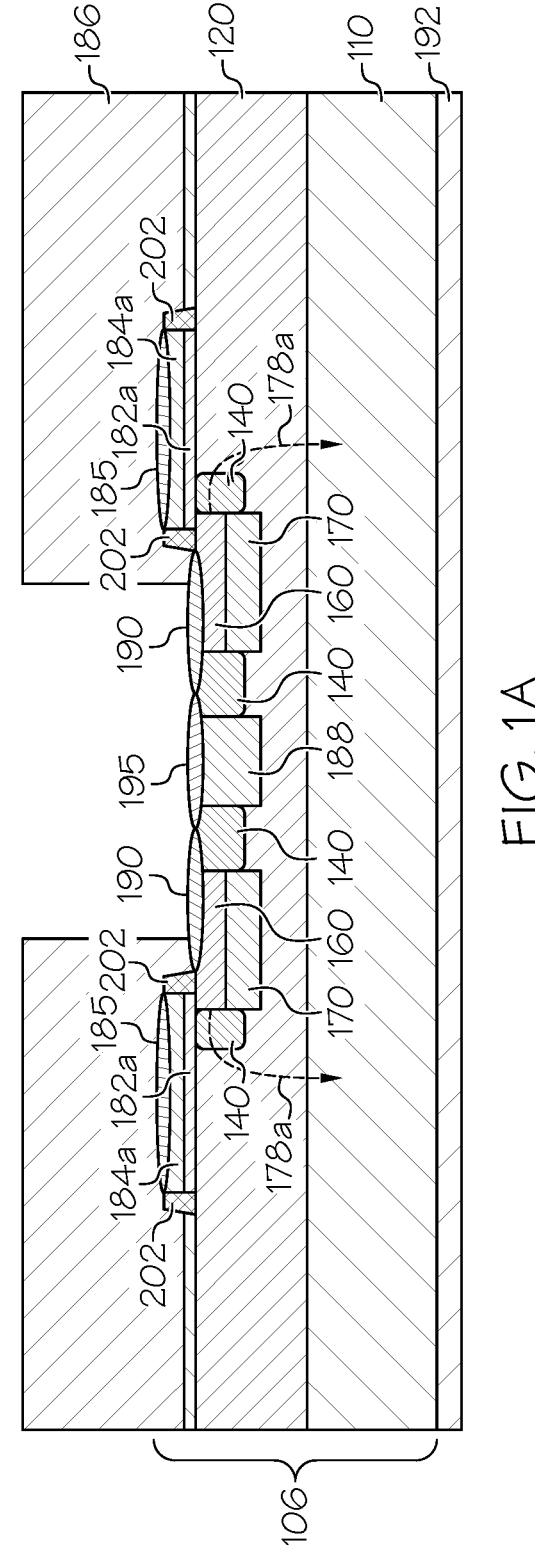
FIGS. 1A and 1B are schematic cross-sectional views illustrating examples of power semiconductor devices having planar and trenched transistor structures, respectively, with improved or optimized contacts according to some embodiments of the present invention.

Vertical power semiconductor devices that include a MOSFET transistor may be implemented using several different wide bandgap semiconductor structures. For example, a planar MOSFET structure may include a standard gate electrode design in which the gate electrode of the transistor is formed on top of the semiconductor layer structure. A trench MOSFET structure may include the gate electrode buried in a trench within the semiconductor layer structure, and may also be referred to as a gate trench MOSFET. These vertical power semiconductor device structures utilize a p-n junction barrier and the inversion of a doped well region to provide electron flow from source to drain in a vertical direction. Although described and illustrated herein with reference to regions of specific conductivity types (i.e., n-type and p-type) by way of example, it will be understood that the conductivity types of the regions in any of the illustrated examples may be reversed (i.e., p-type and n-type) in accordance with embodiments of the present invention.

Some embodiments of the present invention may arise from realization that conventional fabrication processes may impose limitations on device characteristics, such as contact resistance and/or current distribution. For example, in SiC-based devices, some conventional device fabrication operations may use the same silicide metal (or metals) and the same silicide anneal conditions for forming ohmic contacts to both n-type and p-type SiC contact regions simultaneously; however, when limited to a single choice of silicide metal(s) and anneal temperatures, the resistance of both n-type and p-type ohmic contacts may each be higher than if the metal deposition, patterning, and anneal processes could be performed independently for each contact. On the other hand, the use of different silicide metals for n-type and p-type ohmic contacts may also be limited, for example, due to patterning process and other fabrication constraints. In particular, some photolithography processes may have a critical dimension (CD) (e.g., in plan view) of about 2 micrometers (μm) and/or alignment of about 200 nanometers (nm), which may be insufficient for sequential patterning of a deposited interlayer dielectric layer to separately form n-type and p-type ohmic contacts. Also, lower temperature metal silicides may be degraded when exposed to anneal temperatures for forming higher temperature metal silicides.

Embodiments of the present invention provide devices and related methods for separate or sequential fabrication of n-type and p-type ohmic contacts, and in some embodiments gate contacts, with desired and/or optimized characteristics. In particular, some embodiments of the present invention provide a methodology and process flow for a multiple silicide approach for separately optimizing resistance and/or other characteristics of silicided n-type ohmic contacts, silicided p-type ohmic contacts, and silicided gate contacts, in a SiC or other wide bandgap semiconductor transistor structure. The deposition of the silicide metals and the anneal temperatures for forming the n-type and p-type contacts may be implemented and/or optimized independently, in some embodiments in combination with fabrication of a silicide metal for a gate contact that is also independent of the fabrication of the n-type and p-type ohmic contacts with respect to the choice of silicide material and anneal temperatures.

Different metals may thus be used for n-type ohmic contacts, p-type ohmic contacts, and/or gate contacts. Different anneal temperature schemes may also be used for each contact type, and may be optimized for the respective contact types. Embodiments of the present invention may also provide operations for siliciding gate contacts on polysilicon gates and/or interconnects using a lower temperature silicide process (e.g., using Ti or Co as contact metals) without being subjected to a post interlevel dielectric anneal or other higher-temperature processes that may cause such low temperature silicides to migrate or agglomerate. For example, the different anneal temperatures for each contact (n-type ohmic, p-type ohmic, and/or gate) may be implemented in a sequentially decreasing manner, with the contacts requiring higher anneal temperatures for optimization (e.g., the source contacts) formed prior to the contacts requiring lower anneal temperatures for optimization (e.g., the gate contacts or the well/base contacts), so as to prevent degradation of characteristics of the contacts formed using the lower temperature processes.

In particular, as described in detail below, some embodiments of the present invention may provide operations for separate deposition of metals and separate anneal temperature cycles for n-type ohmic contacts, p-type ohmic contacts, and/or gate contacts. The separate fabrication processes for the n-type ohmic contacts, p-type ohmic contacts, and/or gate contacts may be implemented before or after deposition of one or more intermetal dielectric (IMD) layers, more generally referred to herein as interlayer dielectric (ILD) layer(s). While illustrated herein primarily with reference to vertical power semiconductor devices, it will be understood that embodiments of the present invention may include lateral power semiconductor devices as well.

FIGS. 1A-1D are schematic cross-sectional views illustrating examples of vertical power semiconductor devices, illustrated as a partial unit cell of a planar MOSFET 100a, 100c or a trench MOSFET 100b, 100d. It will be understood that the unit cells 100a-100d may be replicated in one or more dimensions to define a power semiconductor device as described herein. Also, additional well and source regions of adjacent unit cells (e.g., on the opposite sides of the gates 184 from the illustrated well 140 and source 160 regions) are omitted from the figures for ease of illustration.

As shown in FIGS. 1A-1D, the power MOSFETs 100a, 100b, 100c, 100d (collectively 100) each include a substrate 110 of a first conductivity type (e.g., n-type) formed from a wide bandgap semiconductor material, for example, silicon carbide. The substrate 110 may define a drain region for the devices 100, and a drain contact 192 may be provided thereon. A drift layer or region 120 of the first conductivity type is provided on the substrate 110, for example, by epitaxial growth. The drift region 120 may be doped with impurities of the first conductivity type (e.g., nitrogen (N) or phosphorous (P) for an n-type drift region), and may have a dopant concentration of about $5\times10^{14}$ to $5\times10^{17}$ atoms/cm$^3$, for example, about $5\times10^{15}$ to $5\times10^{16}$, about $8\times10^{15}$ to $2\times10^{16}$ atoms/cm$^3$, or about $9\times10^{15}$ to $1\times10^{16}$ atoms/cm$^3$. For example, the substrate 110 may be a n-type (e.g., n$^+$) silicon carbide substrate, and a lightly-doped (e.g., n$^-$) n-type drift layer or region 120 may be epitaxially grown on the substrate 110. In some embodiments, a portion of the drift region 120 may include a current spreading layer ("CSL") of the first conductivity type and having a higher doping or dopant concentration than the drift region 120. Moderately- or heavily-doped regions of a second conductivity type (e.g., p-type) are formed (for example, by epitaxial growth or implantation) on the drift region 120 and acts as base or well regions (or "wells") 140, 170 for the devices 100. A heavily-doped base or well contact region 188 of the second conductivity type (e.g., p+) is formed adjacent the well regions 140. The p-n junction between the second conductivity type well contact region 188 and the first conductivity type drift region 120 may define a diode in the semiconductor layer structure 106, also referred to herein as a body diode.

Heavily-doped source regions 160 of the first conductivity type (e.g., n+) are formed in upper portions of the well regions 170, for example, via ion implantation. The source region 160 may be doped with n-type impurities, and may have a dopant concentration of about $5\times10^{18}$ to $5\times10^{21}$ atoms/cm$^3$, for example, about $8\times10^{18}$ to $1\times10^{21}$ atoms/cm$^3$, about $1\times10^{19}$ to $5\times10^{20}$ atoms/cm$^3$, or about $5\times10^{19}$ to $1\times10^{20}$ atoms/cm$^3$. That is, the source region 160 has a dopant concentration that is greater than the dopant concentration of the drift region 120, e.g., by a factor of about 10 or more in some embodiments. The substrate 110, drift region 120 (including current spreading layer), well regions 140, 170, well contact regions 188, and source regions 160, along with various regions/patterns formed therein, are included in the silicon carbide (or other wide bandgap semiconductor) layer structure 106.

A gate insulating layer, for example oxide layer 182a, 182b (collectively 182), is formed on portions of the drift region 120, the well regions 170, and the source regions 160. A gate electrode (or "gate") 184a, 184b (collectively 184) is formed on the gate oxide layer 182. The gate insulating layer 182 and the gate 184 thereon may be collectively referred to herein as the gate structure 182/184. Spacers 202 (e.g., SiN or SiO$_2$) may be provided on sidewalls of the gate structure 182/184 to prevent silicidation over the sidewalls.

Figure 1B:
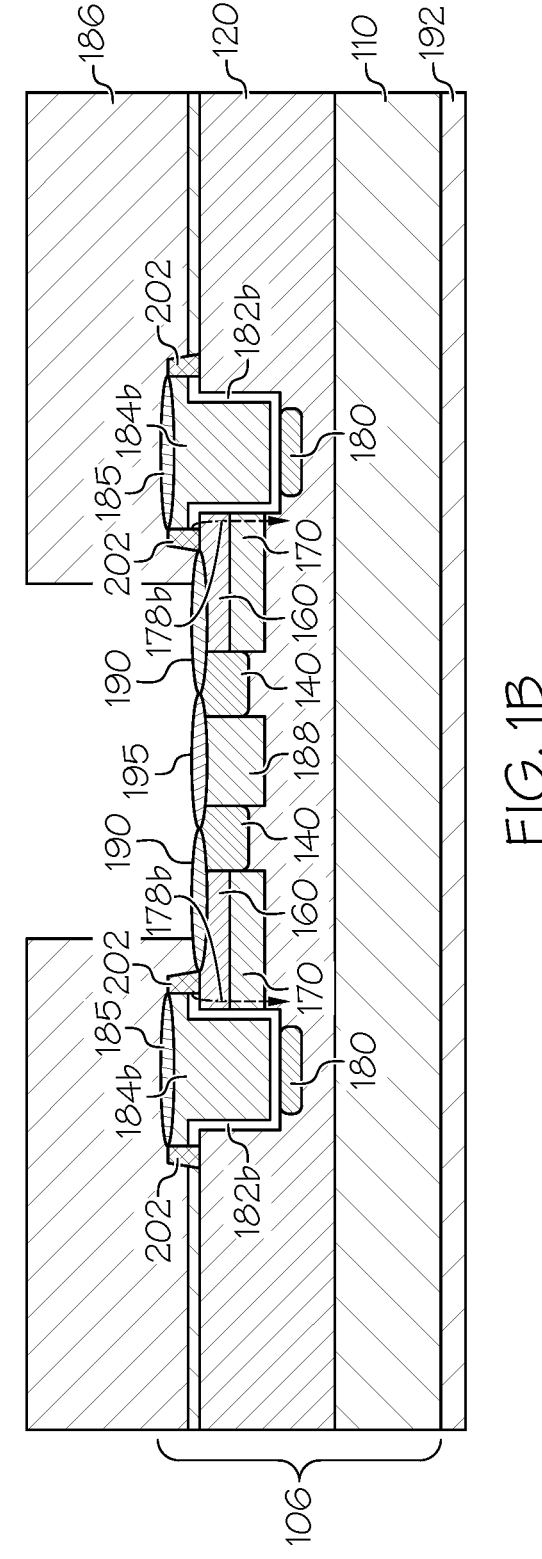
Figure 1C:
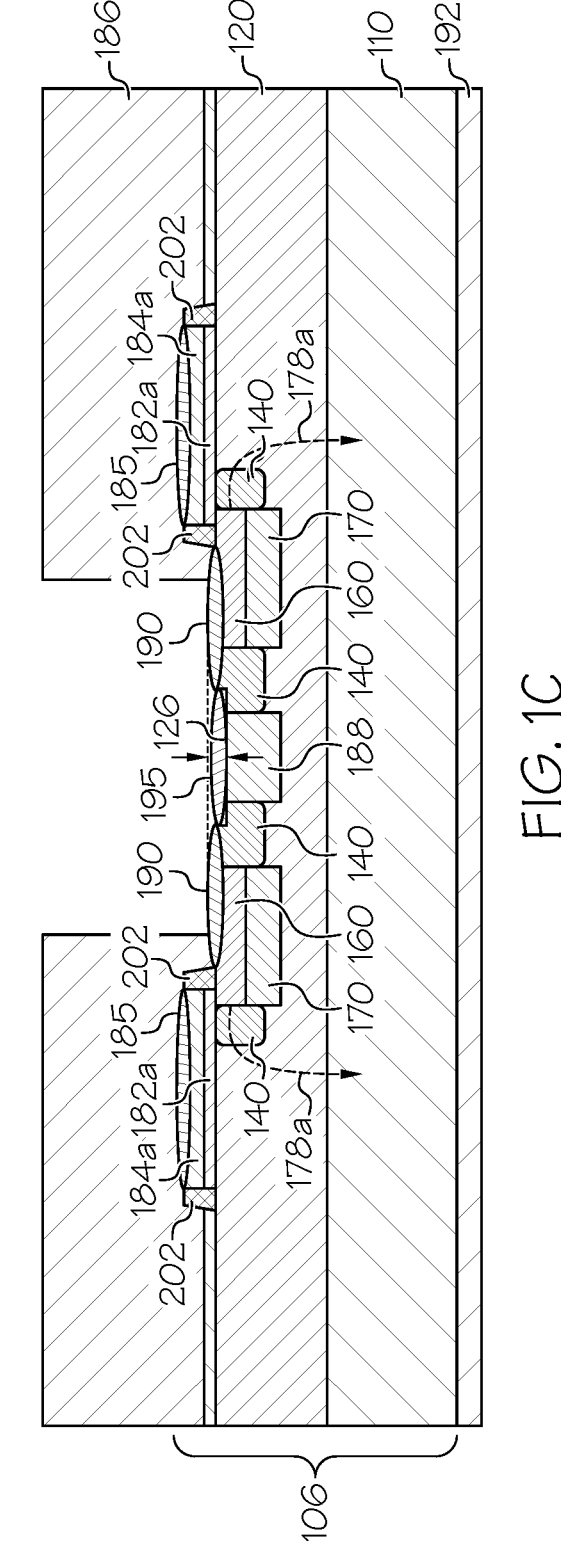
FIGS. 1C and 1D are schematic cross-sectional views illustrating examples of power semiconductor devices having planar and trenched transistor structures, respectively, with improved or optimized contacts according to further embodiments of the present invention.

More particularly, in the planar MOSFETs 100a, 100c of FIGS. 1A and 1C, the gate oxide layer 182a is formed on portions of the drift region 120, the well regions 140, and the source regions 160 adjacent a surface of the semiconductor layer structure 106, and the gate 184a is formed on the gate oxide layer 182a extending along the surface of the structure 106. A transistor channel region 178a for each planar MOSFET 100a, 100c unit cell (with conduction shown by dashed arrows) is defined through the wells 140 and the portions of the drift region 120 underneath the gate 184a. For example, the inversion channel 178a of planar SiC MOSFET may be on the Si-face of SiC.

Figure 1D:
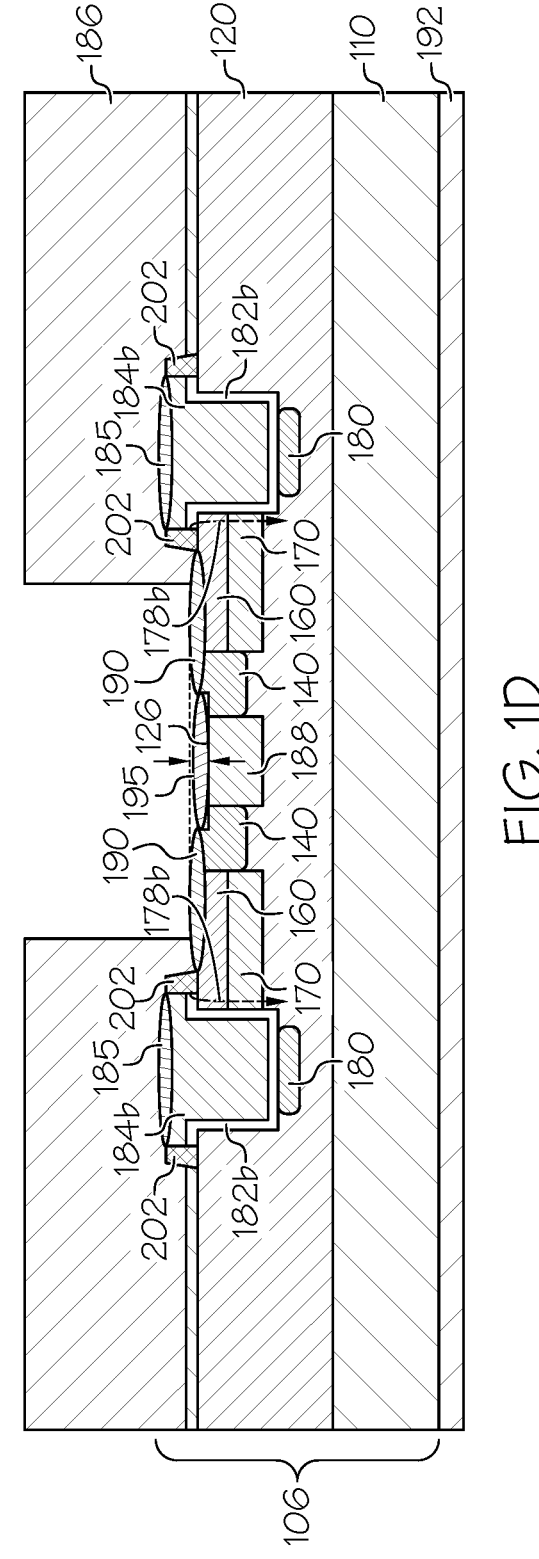

In the trench MOSFETs 100b, 100d of FIGS. 1B and 1D, a gate trench is formed extending from the surface of the semiconductor layer structure 106 into the drift region 120, the gate oxide layer 182b is formed on sidewalls and a bottom surface of the gate trench, and the gate 184b is formed on the gate oxide layer 182a to fill the gate trench. Transistor channel regions 178b for each trench MOSFET 100b, 100d unit cell (with conduction shown by dashed arrows) are defined vertically through the wells 170 (which may be more moderately doped in FIGS. 1B and 1D, as compared to FIGS. 1A and 1C) along sidewalls of the gate trench. For example, the inversion channel 178b of a trench SiC MOSFET may be along the sidewalls of the trench, on the a-face or the m-face of SiC. The trench MOSFETs 100b, 100d of FIGS. 1B and 1D further include shielding patterns 180 underneath the gate trench in order to reduce the electric field levels in the gate insulating layer 182b, particularly at corners of the gate trenches where the electric field levels may be more concentrated. The shielding patterns 180 may include doped semiconductor layers having the same conductivity type (in this example, p-type) as the well regions 140, 170, but having a greater dopant concentration (e.g., p+) than the well regions 140, 170.

As described herein, embodiments of the present invention may allow for fabrication of n-type and p-type ohmic contacts, and in some embodiments gate contacts, with desired or optimized materials and/or characteristics. As shown in FIGS. 1A-1D, the power MOSFETs 100a, 100b, 100c, 100d each include conductive contacts 185, 190, and 195 on the gates 184, source regions 160, and well contact regions 188, respectively. The contacts 190 and 195 may laterally extend beyond the source regions 160 and well contact regions 188 and onto adjacent well regions 140 in some embodiments. The contacts 190 and 195 may be ohmic contacts of different materials. An ohmic contact may refer to a non-rectifying electrical junction between two conductors (e.g., a metal and a semiconductor) that has a linear current-voltage (I-V) curve. Suitable metals for forming ohmic contacts may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSi$_x$, titanium silicide (TiSi), titanium nitride (TiN), WSiN, Pt and the like. Thus, the contacts 190 and/or 195 may contain an ohmic contact portion in direct contact with the epitaxial layer 120, or more generally, with the semiconductor layer structure 120. In some embodiments, the contacts 190 and/or 195 may be formed of a plurality of layers or metals.

For example, for a SiC semiconductor layer structure 120, different first and second metals or metal compounds may be formed on the source region 160 and the well contact region 188, respectively, and may be silicided (e.g., using respective anneal processes, as described below) to form the ohmic contacts 190 and 195 with desired characteristics on regions 160 and 188 of opposite conductivity types. In some embodiments, the ohmic contacts 190 and 195 may each have a contact resistance of less than about $5\times10^{-3}$ ohm-cm$^2$, e.g., less than about $1\times10^{-3}$ ohm-cm$^2$ or less than about $1\times10^{-4}$ ohm-cm$^2$. In some embodiments, a third metal or metal compound, different than the first and second metals/compounds, may be formed on the gates 184 and may be silicided to form the metal gate contacts 185 with desired characteristics on the gates 184. In some embodiments, the contacts 185, 190, and/or 195 may have one or more dimensions that are smaller than the CD for some conventional patterning processes. For example, the contacts 185, 190, and/or 195 may have at least one dimension in plan view (e.g., along a length or width direction) of less than about 2 μm, e.g., about 2 μm to about 1 μm. For instance, a total width of the contacts 185, 190, and 195 may be about 1.75 μm to about 1.25 μm, for example, about 1.5 μm or about 1 μm in some embodiments.

One or more dielectric layers 186, such as intermetal dielectric (IMD) layer(s) (more generally referred to herein as interlayer dielectric (ILD) layer(s)), are formed on a surface of the semiconductor layer structure 106 including the first ohmic contact 190, the second ohmic contact 195, and the gate contact 185 thereon. The dielectric layer(s) 186 may differ from final passivation layers in materials, thicknesses, and/or functionality. For example, the dielectric layer(s) may be configured to insulate the contacts 185, 190, and/or 195 from subsequent interconnect layers, such as the metal contact layer(s) 196a, 196b described below. A drain contact 192 may be formed on the lower surface of the substrate 110, opposite to the dielectric layer(s) 186.

In some embodiments, as shown in FIGS. 1A and 1B, the dielectric layer(s) 186 laterally extend onto edges of the first ohmic contacts 190, for instance, adjacent the gate contacts 184. For example, the first ohmic contact 190, the second ohmic contact 195, and the gate contact 185 may be formed before formation of the dielectric layer(s) 186, e.g., as described below with reference to FIGS. 2-12B.

In further embodiments, as shown in FIGS. 1C and 1D, edges of the first ohmic contacts 190 are free of the dielectric layer(s) 186 (i.e., the dielectric layer(s) 186 do not vertically overlap the first ohmic contacts 190). Surfaces of the well contact regions 188 having the second ohmic contact 195 thereon may be recessed (e.g., to define a step difference 126 in a vertical direction that is perpendicular to the major surface of the semiconductor layer structure 106) relative to surfaces of the source regions 160 having the first ohmic contacts 190 thereon. That is, portions of the surface of the semiconductor layer structure 106 having the second ohmic contacts 195 thereon may be recessed relative to portions of the surface having the first ohmic contacts 190 thereon. The step difference may be greater than about 10 nanometers (nm) but less than about 100 nm, e.g., between about 15 nm and about 50 nm. For example, the first ohmic contacts 190 and the second ohmic contacts 195 may be sequentially formed after formation of the dielectric layer(s) 186, e.g., as described below with reference to FIGS. 13-19.

FIGS. 2-12B illustrate intermediate fabrication operations in methods of fabricating vertical power semiconductor devices with improved or optimized n- and p-type ohmic contacts according to some embodiments of the present invention. The example processes shown in FIGS. 2-12B may be used to form the planar transistor device 100a of FIG. 1A, but it will be understood that the trenched transistor device 100b of FIG. 1B may be similarly formed. The fabrication operations of FIGS. 2-12B are implemented before formation of the dielectric layer(s) 186, also referred to herein as interlayer dielectric (ILD) layers. In contrast, some conventional operations for forming ohmic contacts to n-type and p-type SiC regions may be implemented after the ILD layer(s) has been deposited, and the same metal(s) may be deposited simultaneously onto both n-type and p-type SiC regions through contact openings etched into the ILD layer(s) for silicidation.

Figures 2, 3:
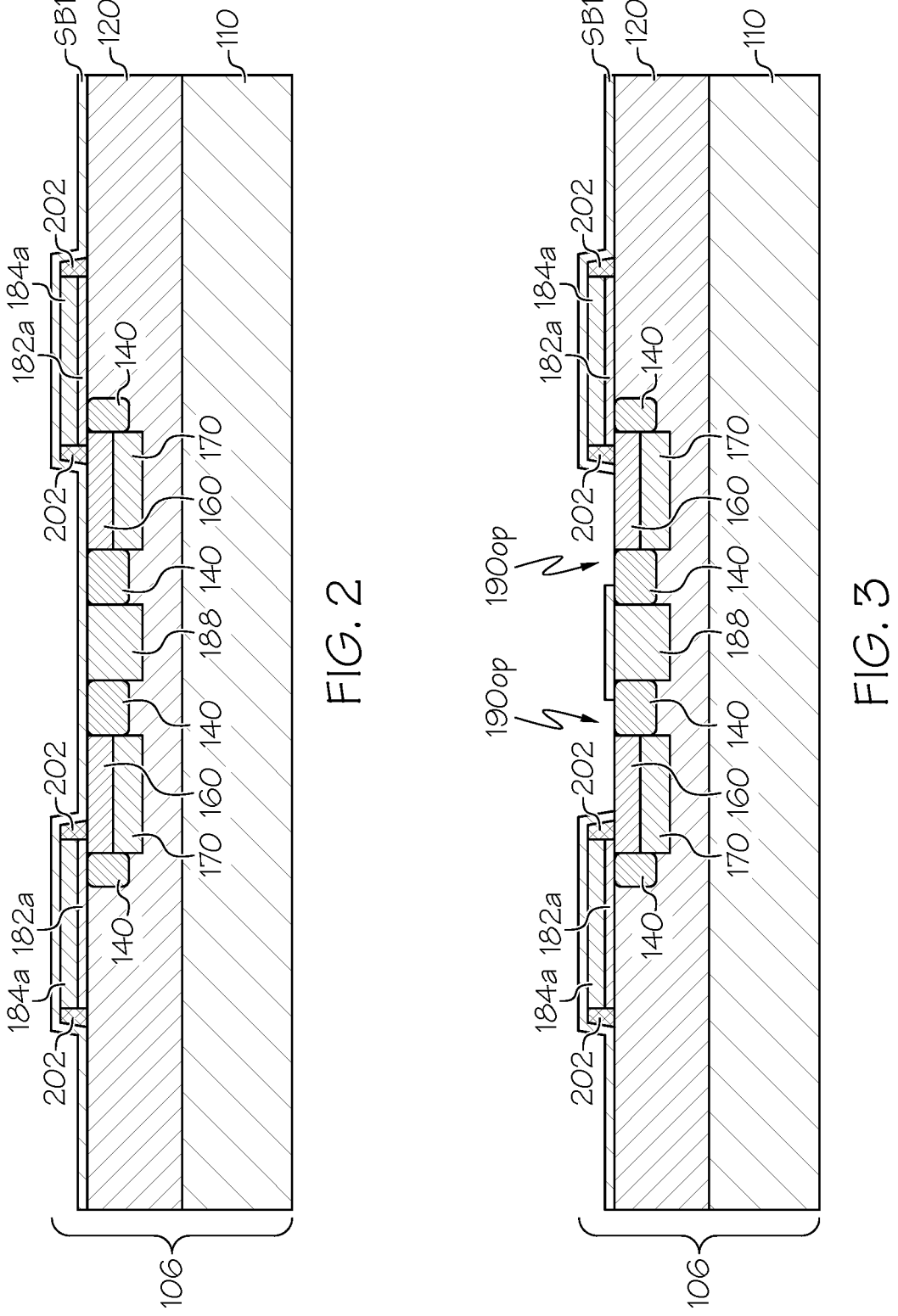
FIGS. 2, 3, 4, 5, 6, 7, 8, 9, 10, 11, 12A, and 12B are schematic cross-sectional views illustrating intermediate fabrication operations in methods of fabricating power semiconductor devices with improved or optimized contacts according to some embodiments of the present invention.

As shown in FIG. 2, after forming the drift region 120 on the substrate 110, and after forming the base/well regions 140/170, source regions 160, base/well contact regions 188, and gate structures 182/184 on the drift region 120, a polysilicon reoxidation process may be performed, and etch-selective spacers 202 (e.g., SiN or other nitride-based spacers with etch selectivity to the oxide and/or ILD layers described herein) may be formed on sidewalls of the gate structures 182/184. A first oxide layer SB1 is formed on the surface of the semiconductor layer structure 106, covering the gate structures 182/184, the source regions 160, and the well contact regions 188.

Figure 4:
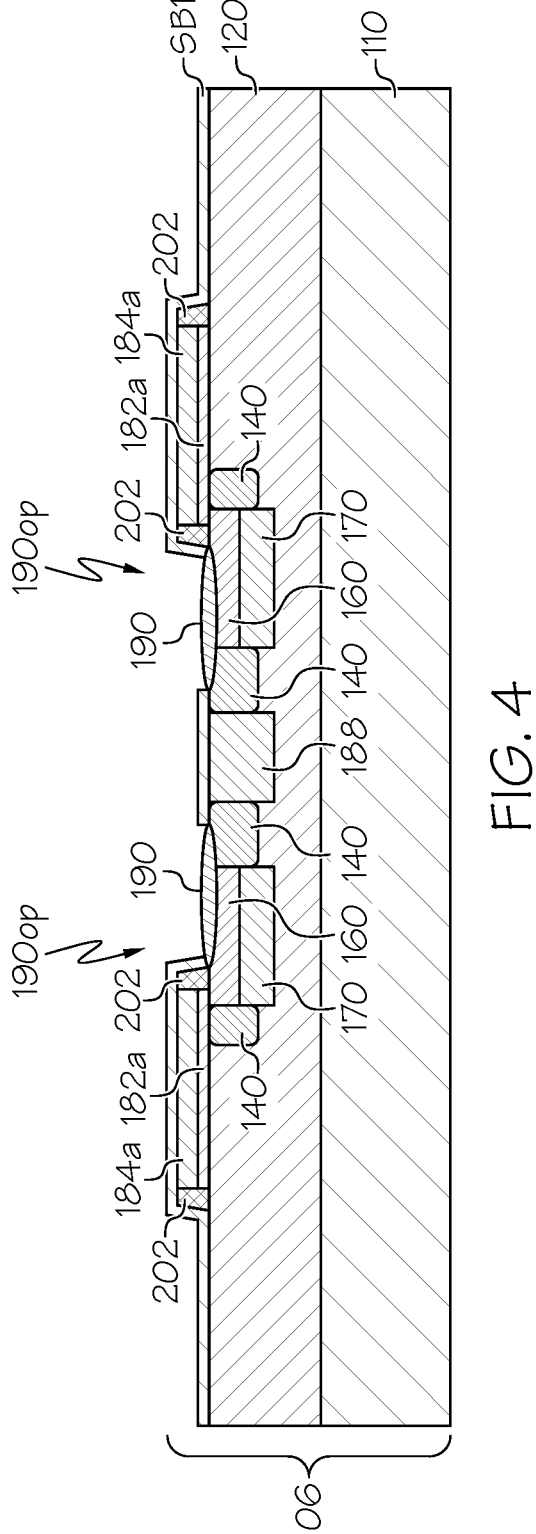

As shown in FIG. 3, the first oxide layer SB1 is patterned to define openings 190op therein that expose surfaces of the source regions 190. As shown in FIG. 4, one or more first metals (e.g., nickel (Ni)) are deposited in the openings 190op and are reacted with the exposed surfaces of the source regions 190 to form the first ohmic contacts 190 of a first metal silicide (e.g., NiSi). For example, one or more annealing (e.g., rapid thermal anneal (RTA)) processes and/or etching processes may be performed to silicide the first metal(s) and form the first ohmic contacts 190 of the first metal silicide on the source regions 160. The annealing process(es) may be formed at a relatively high temperature (e.g., 700 degrees to 1000 degrees Celsius (C), for example, 900 degrees C.) to form the first metal silicide for the first ohmic contacts 190. Because the remaining contacts 195, 185 are to be formed in subsequent processes, the metal(s), temperature(s) and/or other fabrication conditions of FIG. 4 can be independently selected so as to optimize resistance, current distribution, and/or other characteristics of the first ohmic contacts 190, without degrading or otherwise negatively affecting the remaining contacts 195, 185.

Figure 5:
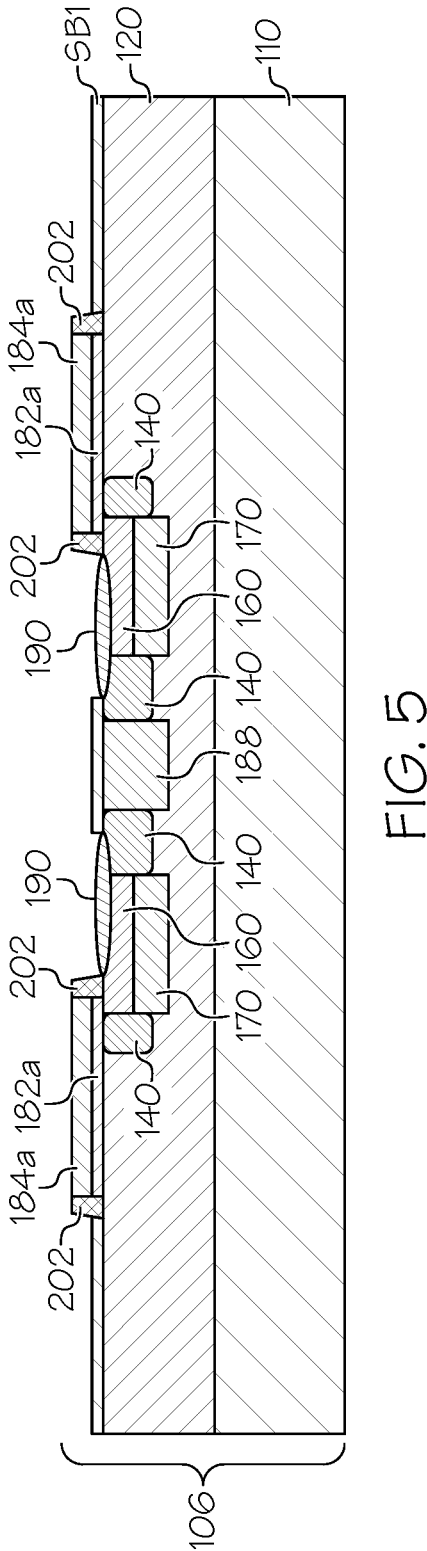
Figure 6:
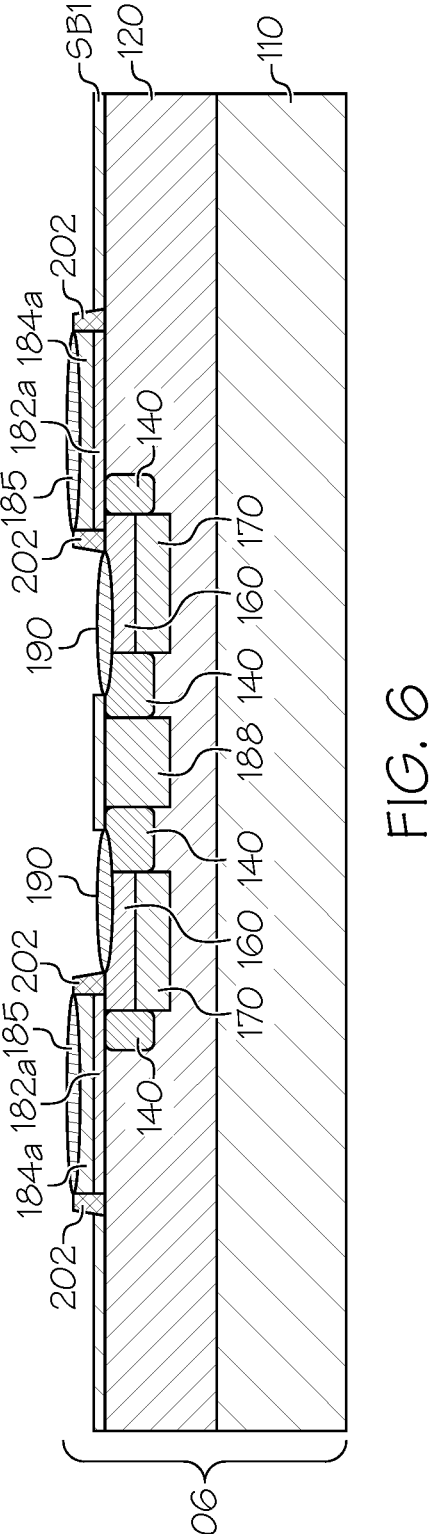

As shown in FIG. 5, after forming the first ohmic contacts 190 on the source regions 160, the first oxide layer SB1 is patterned to expose the gate structure 182/184. The gates may be polysilicon in some embodiments. As shown in FIG. 6, one or more metals (e.g., titanium (Ti) or cobalt (Co)), which may be different than the metal or compounds for the ohmic contacts 190, are deposited on and reacted with the exposed gates 184 to form the gate contacts 185 of a metal silicide (e.g., TiSi). For example, one or more annealing (e.g., RTA) processes and/or etching processes may be performed to silicide the metal(s) and form the gate contacts 185 of a metal silicide on the gate structures 182/184. The ohmic contacts 190 may be masked or otherwise protected prior to formation of the gate contacts 185. The metal silicide for the gate contacts 185 may thus be different than and selected independent of the metal silicides for the ohmic contacts 190, 195. The annealing process(es) may likewise be independently performed at a desired temperature (e.g., 500 degrees to 800 degrees C., for example, 700 degrees C.) to form the metal silicide for the gate contacts 185. That is, because the higher temperature silicides for the ohmic contacts 190 have already been formed in previous processes, and the lower temperature silicides for the ohmic contacts 195 are yet to be formed in subsequent processes, the metal(s) and/or fabrication conditions (including anneal temperature(s)) of FIG. 6 can be independently selected so as to optimize resistance, current distribution, and/or other characteristics of the gate contacts 185. For example, the operations described herein may allow for fabrication of polysilicon gates 184 with low-temperature metal silicide gate contacts 185 thereon, as any desired higher-temperature anneal operations (which can cause migration and/or agglomeration of the low-temperature metal silicides) were previously performed.

Figure 7:
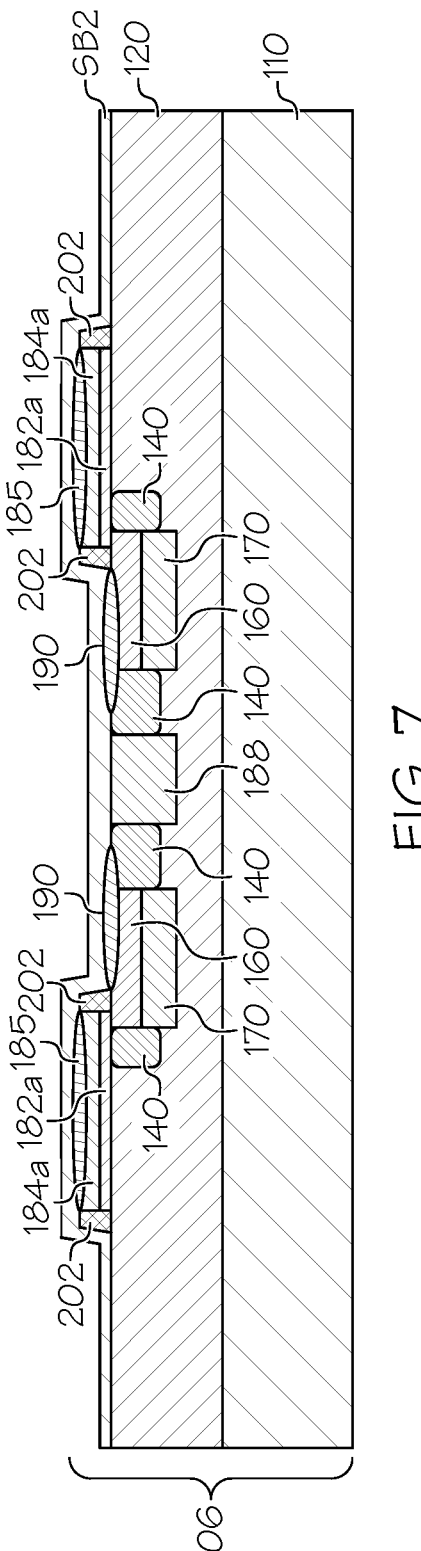
Figures 8, 9:
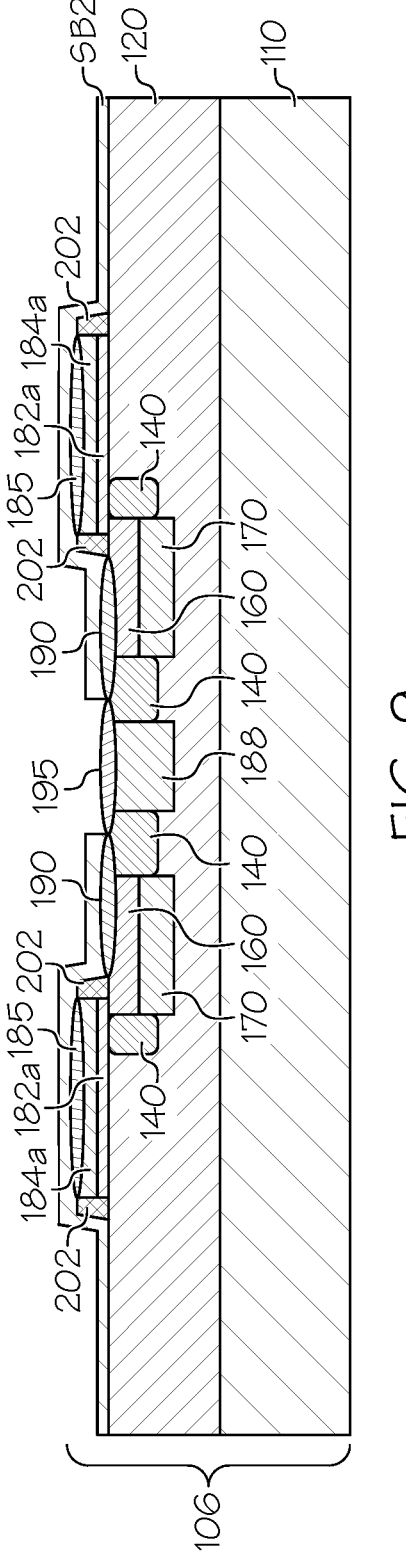

As shown in FIG. 7, after forming the gate contacts 185 on the gate structures 182/184, a second oxide layer SB2 may be formed on the surface of the semiconductor layer structure 106, covering the gate contacts 185, the source contacts 190, and the well contact regions 188. As shown in FIG. 8, the second oxide layer SB2 is patterned to define openings 195op therein that expose surfaces of the well contact regions 188. As shown in FIG. 9, one or more second metals (e.g., Ni, Ti, and/or Al), which may be different than the metal or compounds for the contacts 190 and/or 185, are deposited in the openings 195op and reacted with the exposed well contact regions 188 to form the second ohmic contacts 195 of a second metal silicide (e.g., NiAlSi). For example, one or more annealing (e.g., RTA) processes and/or etching processes may be performed to silicide the second metal(s) and form the second ohmic contacts 195 of the second metal silicide on the well contact regions 188. The second metal silicide for the second ohmic contacts 195 may thus be different than and selected independent of the metal silicides for the contacts 190, 185. The annealing process(es) may likewise be independently performed at a desired, lower temperature (e.g., 400 degrees to 600 degrees C., for example, 500 degrees C.) to form the second metal silicide for the second ohmic contacts 195. That is, because the contacts 190, 185 were formed and optimized in previous processes, the metal(s), temperature(s), and/or other fabrication conditions of FIG. 9 can be independently selected so as to optimize resistance, current distribution, and/or other characteristics of the second ohmic contacts 195.

Figures 10, 11:
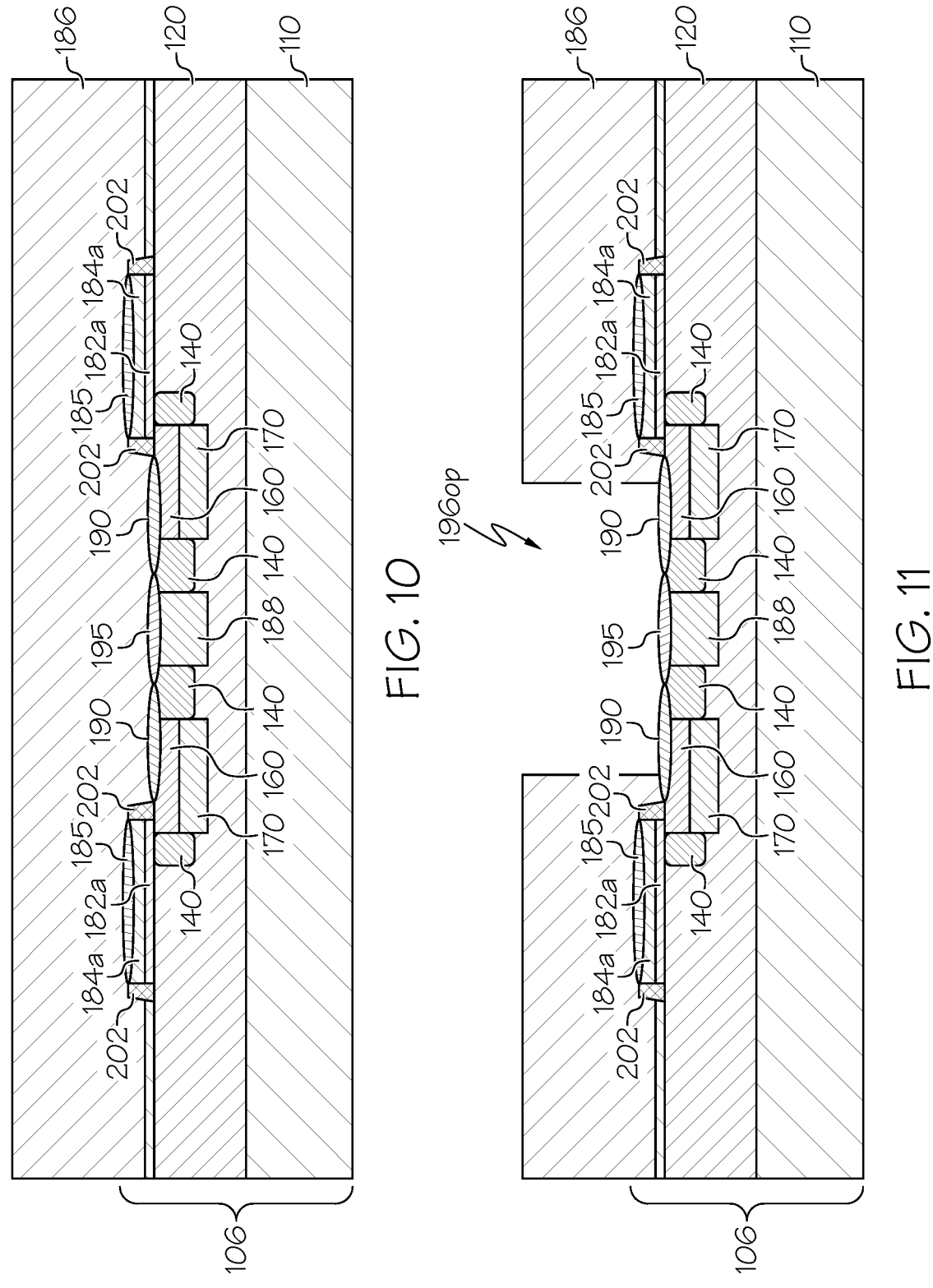

As shown in FIG. 10, one or more dielectric or ILD layers 186 are formed on the surface of the semiconductor layer structure 106, covering the first ohmic contacts 190, the second ohmic contacts 195, and the gate contacts 185. As shown in FIG. 11, the ILD layer(s) 186 are patterned to define a contact opening 196op that exposes the first and second ohmic contacts 190 and 195. As the operations to form the contacts 185, 190, 195 were performed before deposition of the ILD layer(s) 186, portions of the ILD layer(s) 186 may laterally extend onto edges of the first ohmic contacts 190 and/or second ohmic contacts 195 after forming the contact opening 196op. That is, the contact opening 196op in the ILD layer(s) 186 may not completely expose the ohmic contacts 190 and/or 195.

Figure 12A:
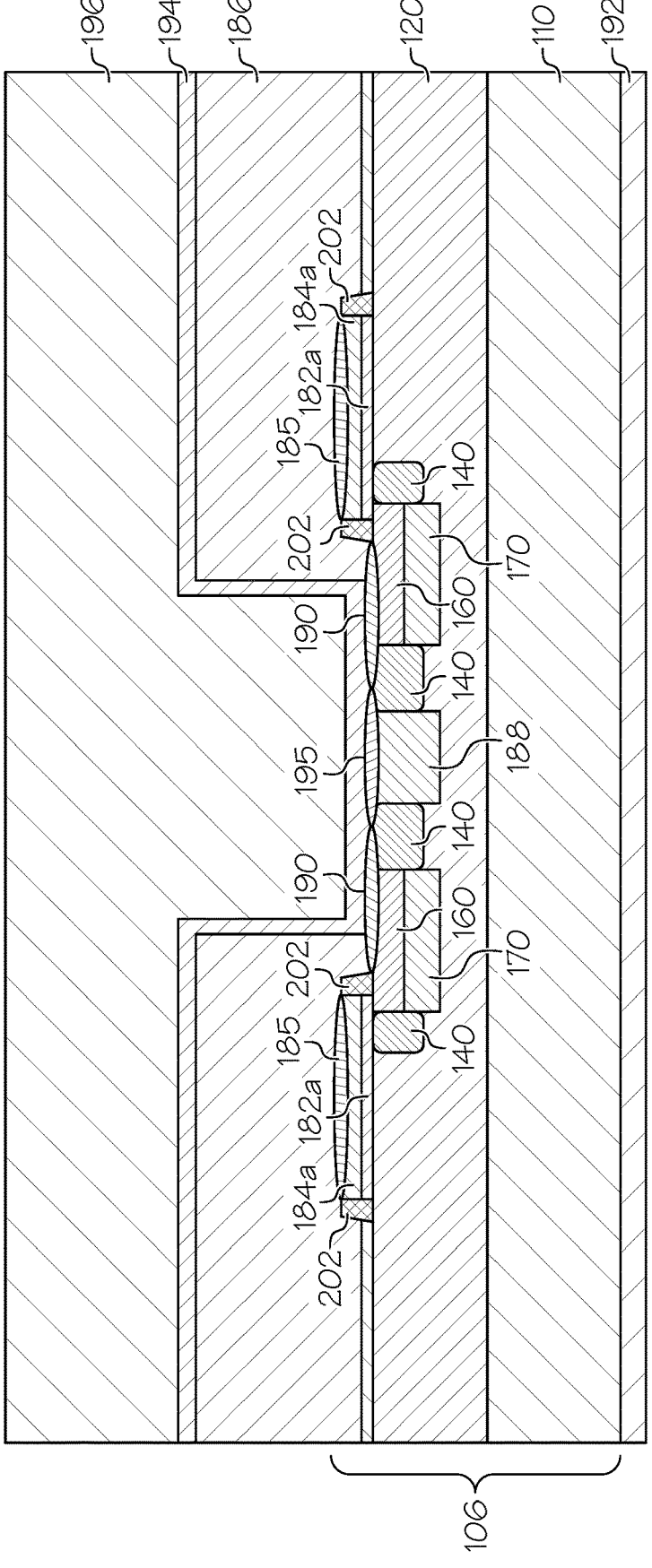
Figure 12B:
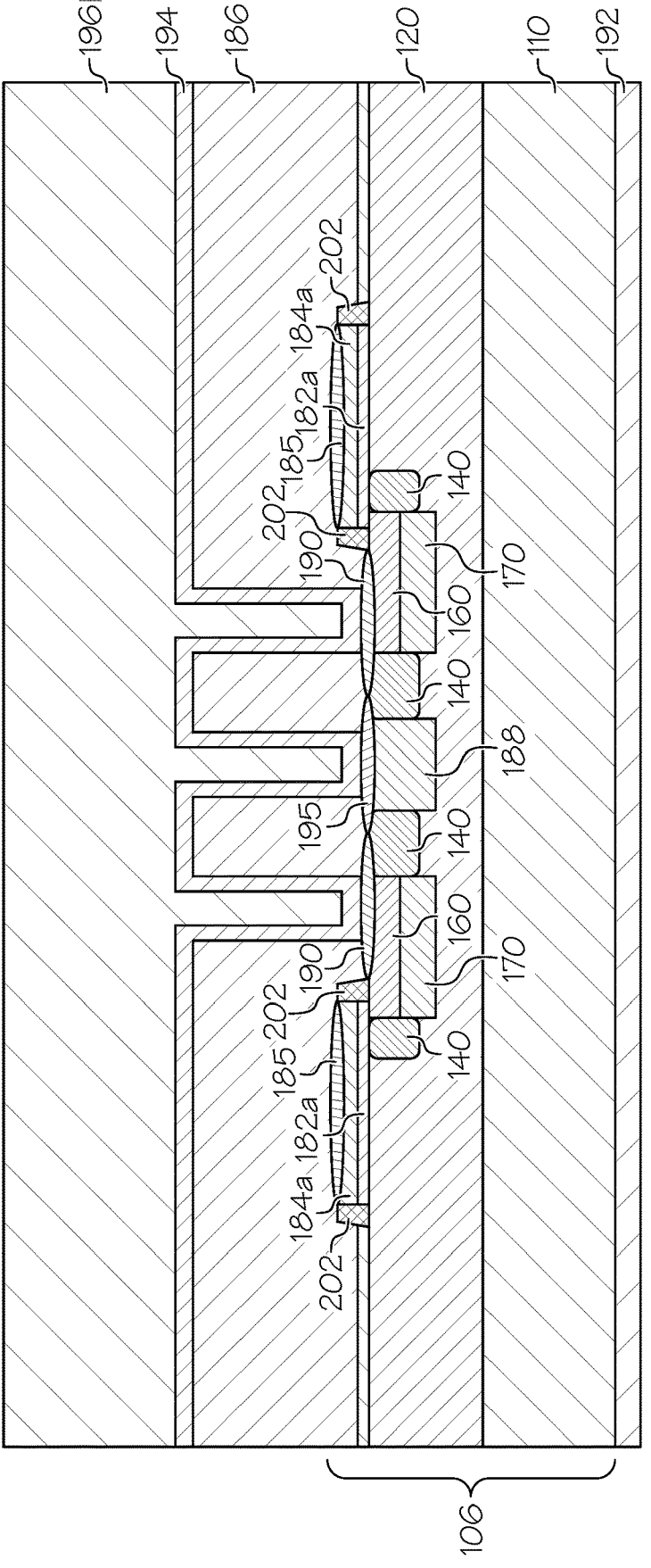

FIGS. 12A and 12B illustrate barrier and contact metal deposition in the contact opening 196op. As shown in FIGS. 12A and 12B, one or more barrier metal layers 194 (e.g., Ti, Al, or TiN) may be conformally formed in the contact opening 196op and on surfaces of the ILD layer(s) 186 outside the contact opening 196op. One or more contact metal layer(s) 196a, 196b (e.g., Al, Ti, tantalum (Ta), or tungsten (W)) are formed on the barrier metal layer(s) 194 to substantially fill the contact opening 196op. The drain contact 192 is also formed (e.g., on a surface of the substrate 110 opposite to the drift region 120), thereby completing the device.

Due to the lateral extension of the ILD layer(s) 186 onto edges of the first ohmic contacts 190 and/or second ohmic contacts 195, the contact metal layer(s) 196a, 196b may contact less than an entirety of the ohmic contacts 190 and/or 195. In particular, in FIG. 12A, the contact opening 196op is implemented as a single, larger contact opening that exposes the first and second ohmic contacts 190 and 195, and the contact metal layer 196a forms a single contact plug. The ILD layer(s) 186 laterally extend onto edges of the first ohmic contacts 190 adjacent the gate structures 182/184, but not onto edges of the second ohmic contact 195, such that the contact metal layer(s) 196a are formed on an entirety of the second ohmic contacts 195, but on less than an entirety of the first ohmic contacts 195. In FIG. 12B, the contact opening 196op is implemented by multiple smaller openings that each expose one of the first and second ohmic contacts 190 and 195, and the contact metal layer 196b forms multiple contact plugs. The metal layer 196a, 196b may be aluminum (Al; for example, formed using a hot Al deposition) and/or tungsten (W; for example, formed using chemical vapor deposition), e.g., with a thicker Al sublayer on a W plug. The ILD layer(s) 186 laterally extend onto edges of the first ohmic contacts 190 adjacent the gate structures 182/184, and also onto edges of the second ohmic contact 195, such that the contact metal layer(s) 196a are formed on less than an entirety of the first and second ohmic contacts 190 and 195.

In the example embodiments of FIGS. 2-12B, the silicidation operations or processes (also referred to herein as silicide modules) are performed before deposition of the ILD layer(s) 186. Polysilicon re-oxidation and nitride-based spacers may be used to form self-aligned silicide (salicide) on the gate structures. The three silicide modules may be sequentially performed from highest temperature to lowest temperature. That is, the silicide process for forming the first ohmic contacts 190 on the source regions 160 may be performed initially at a highest temperature; followed by the silicide process for forming the gate contacts 185 on the polysilicon gates 184 a lower temperature; followed by the silicide process for forming the second ohmic contacts 195 on the well contact regions 188 at the lowest temperature.

No additional polysilicon gate anneal steps may be performed or needed after deposition of the ILD 186.

Implementation of the silicide modules before deposition of the interlevel dielectric (ILD) insulator 186 may thereby allow for independent optimization of characteristics of the gate contacts 185 and/or the ohmic contacts 190 and 195 to the n- and p-type regions of the device. For example, the contact for each region (n-type, p-type, and polysilicon gate/interconnect/resistor) can be selectively blocked from unwanted silicide deposition; the silicide metal(s) for one region can be selected independently from the silicide metal(s) selected for the other regions; and respective anneal temperatures or other processing conditions can be optimized for the particular silicide metal(s) selected for a particular region. Also, the respective metal silicides, including the polysilicon silicide for the gate contacts 185, can be blocked from the polysilicon in regions where it is desired to form polysilicon resistors or diodes.

However, it will be understood that embodiments of the present invention are not limited to implementation of the silicide modules before formation of the ILD layer(s) 186. FIGS. 13-19 illustrate intermediate fabrication operations in methods of fabricating vertical power semiconductor devices with improved or optimized n- and p-type ohmic contacts according to further embodiments of the present invention, which are implemented after formation of the ILD layer(s) 186. The example processes shown in FIGS. 13-19 may be used to form the planar transistor device 100c of FIG. 1C, but it will be understood that the trenched transistor device 100d of FIG. 1D may be similarly formed.

Figures 13, 14:
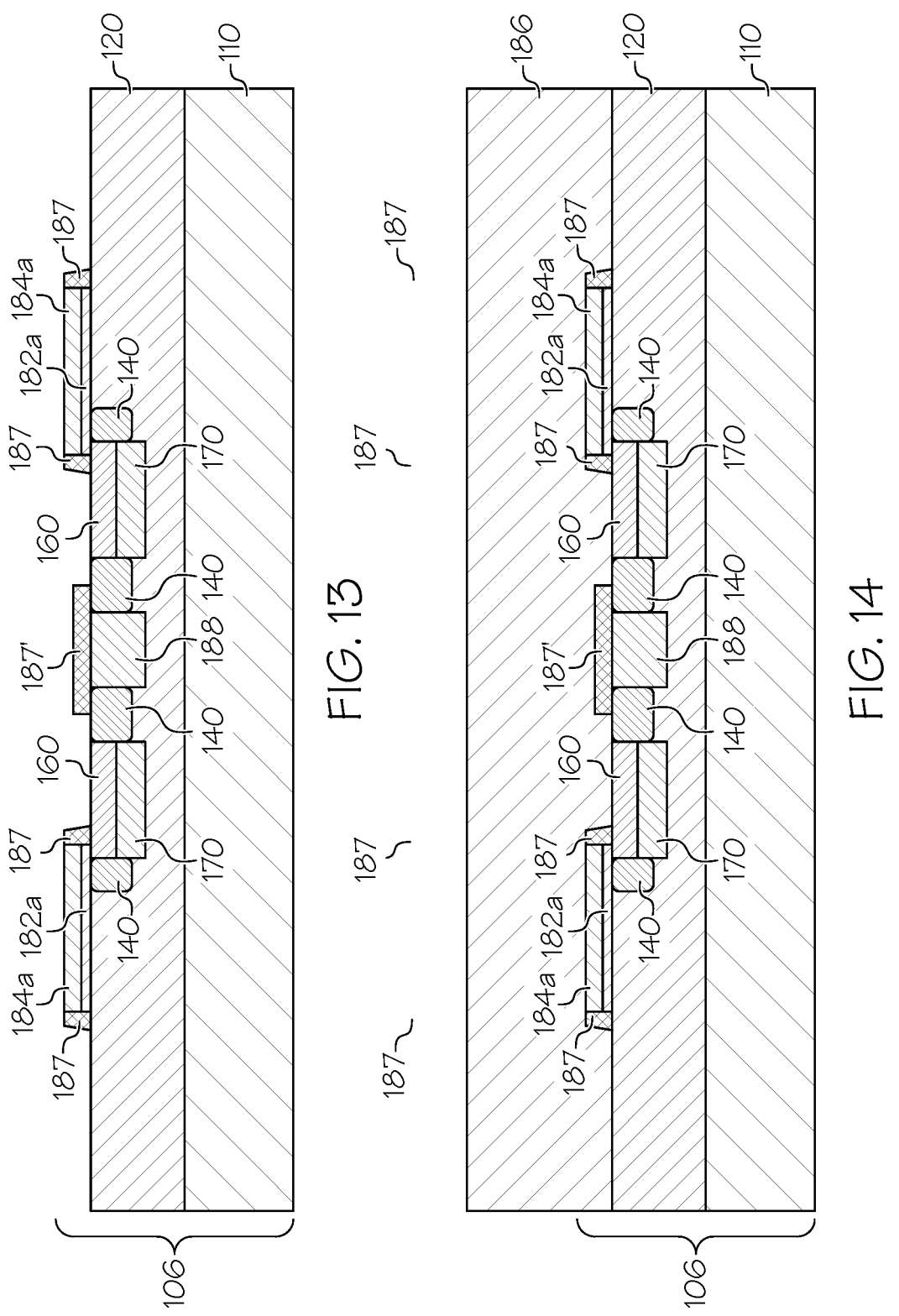
FIGS. 13, 14, 15, 16, 17, 18, and 19 are schematic cross-sectional views illustrating intermediate fabrication operations in methods of fabricating power semiconductor devices with improved or optimized contacts according to further embodiments of the present invention.

As shown in FIG. 13, after forming the drift region 120 on the substrate 110, and after forming the base/well regions 140/170, source regions 160, base/well contact regions 188, and gate structures 182/184 on the drift region 120, a polysilicon reoxidation process may be performed, and respective protective spacers 187 and blocking regions 187' (e.g., usually $SiO_2$ or SiN or other thin film layer) may be formed on sidewalls of the gate structures 182/184 and on the well contact region 188s. For example, a SiN layer may be deposited on the surface of the semiconductor layer structure 106 and anisotropically etched to form the protective spacers 187 on the sidewalls of the gate structures 182/184. The spacers 187 may separate edges of the gate structures from implants or metal deposition. A $SiO_2$ or SiN layer (or other thin film layer) may also be deposited and patterned (e.g. by photolithography and/or etching operations) to form the blocking regions 187' on the well contact regions 188, while exposing the source regions 160. The blocking regions 187' may prevent formation of metallic silicides and/or implants on or in the well contact regions 188, and may be relatively thin (e.g., 100 to 300 Angstroms) in some embodiments. The blocking regions 187' on the well contact regions 188 may laterally extend beyond the well contact regions 188 and onto the adjacent edges of the well regions 140 in some embodiments.

Figures 15, 16:
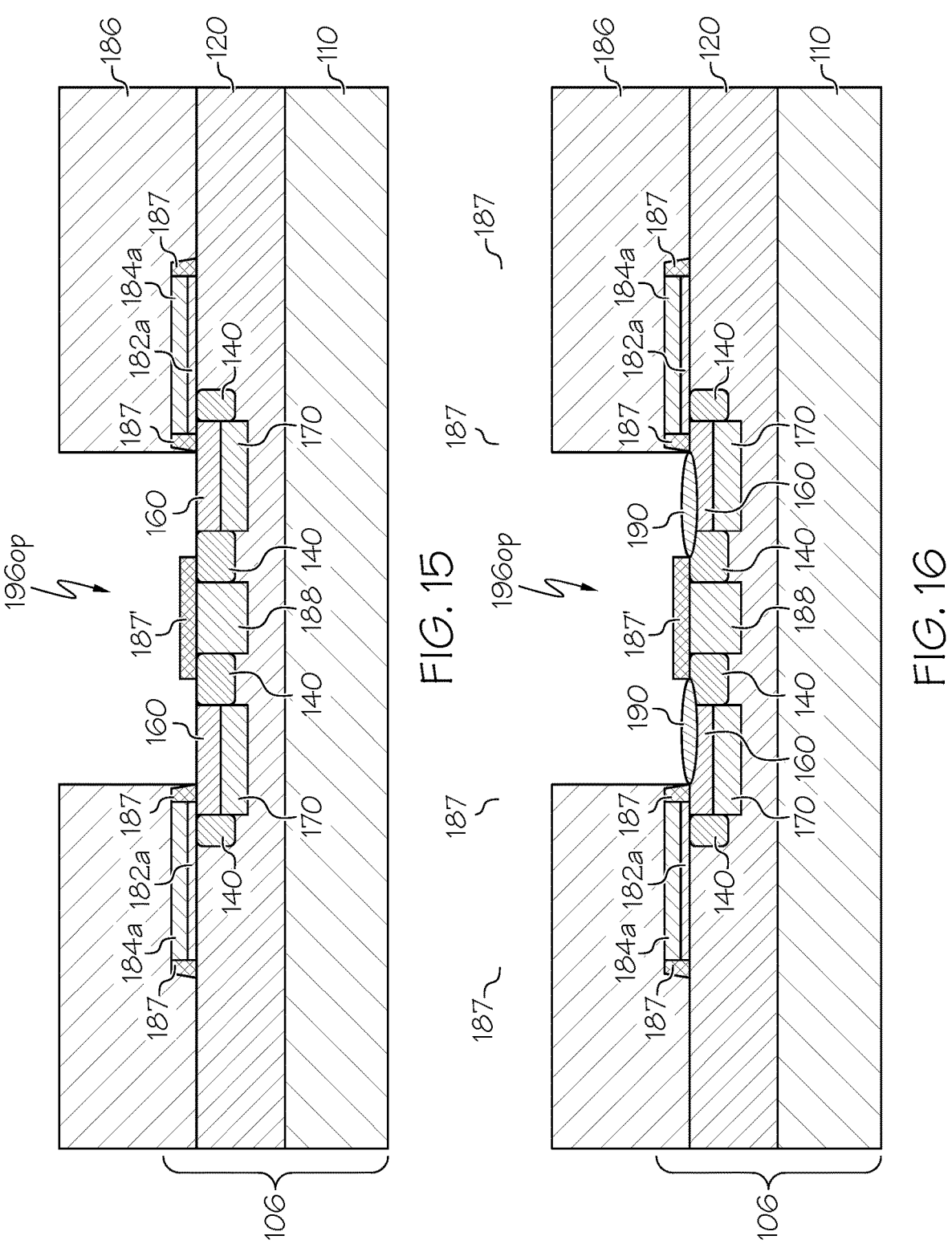

As shown in FIG. 14, one or more ILD layers 186 are formed on the surface of the semiconductor layer structure 106, covering the source regions 160 and covering the base/well contact regions 188 and gate structures 182/184 having the blocking regions 187' and protective spacers 187 thereon. As shown in FIG. 15, the ILD layer(s) are 186 are patterned to define a contact openings 196op that exposes the source regions 160 and the blocking regions 187' on the well contact regions 188. For example, patterning process may be configured to selectively etch exposed portions of the ILD layer(s) 186 to define the contact openings 196*op* without substantially etching the drift region 120 and/or the blocking regions 187'.

As shown in FIG. 16, one or more first metals (e.g., nickel (Ni)) are deposited in the contact opening 196*op* and are reacted with the exposed surfaces of the source regions 160 to form the first ohmic contacts 190 of a first metal silicide (e.g., NiSi). For example, one or more annealing (e.g., rapid thermal anneal (RTA)) processes and/or etching processes are performed to silicide the first metal(s) and form the first ohmic contacts 190 of the first metal silicide on the source regions 160. The annealing process(es) may be formed at a relatively high temperature (e.g., 700 degrees to 1000 degrees Celsius (C), for example, 900 degrees C.) to form the first metal silicide for the first ohmic contacts 190. One or more masking and/or etching steps may also be performed to remove portions of the first metals deposited outside of the surfaces of the source regions 160. As similarly noted above, because the remaining contacts 195, 185 are to be formed in subsequent processes, the metal(s), temperature(s) and/or other fabrication conditions of FIG. 16 can be independently selected so as to optimize resistance, current distribution, and/or other characteristics of the first ohmic contacts 190. Also, because the first ohmic contacts 190 are formed after the ILD layer(s) 186, the contact opening 196*op* may completely expose the first ohmic contacts 190. That is, edges of the first ohmic contacts 190 adjacent the gate structures 182/184 may be free of the ILD layer(s) 186.

Figures 17, 18:
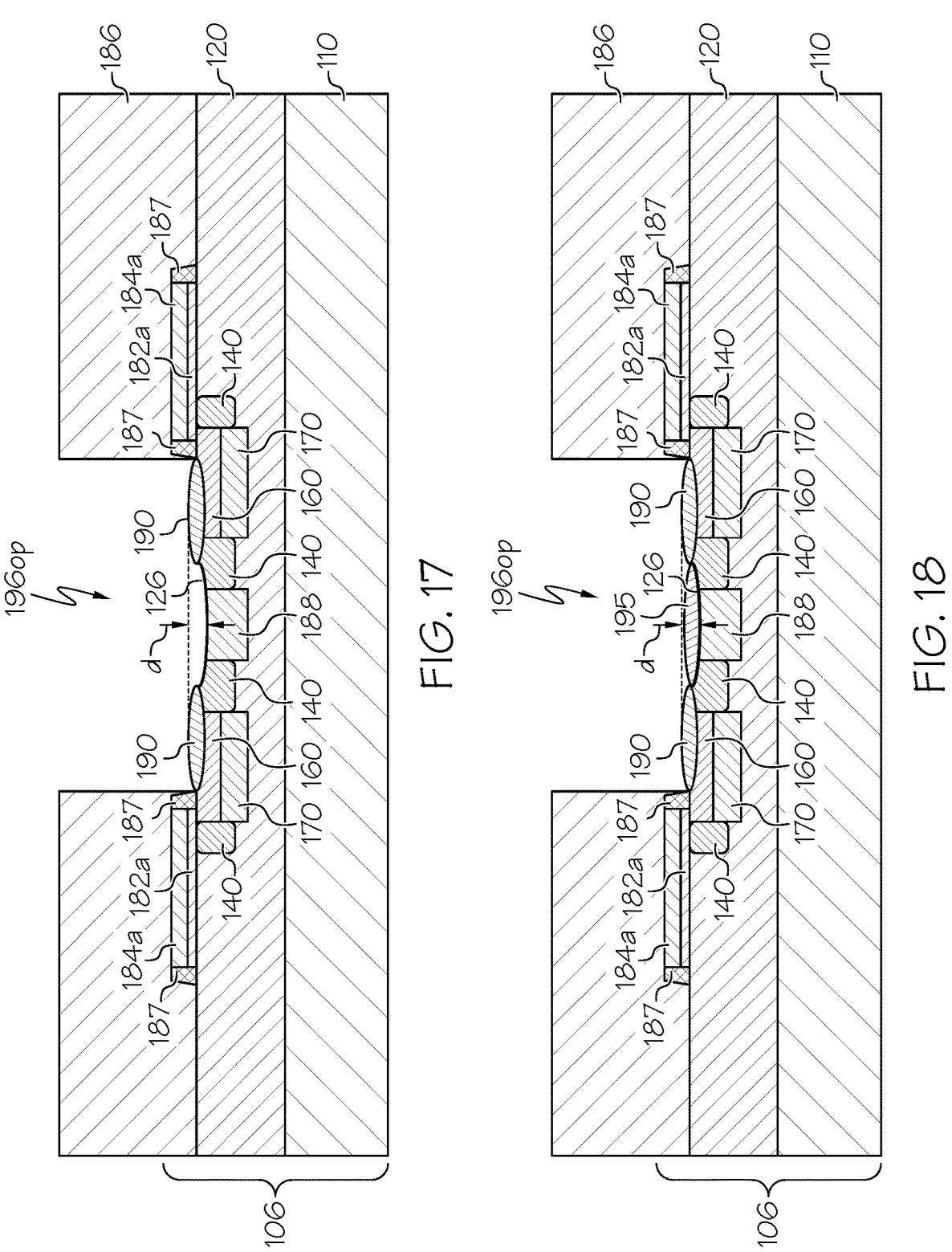

As shown in FIG. 17, the blocking regions 187' on the well contact regions 188 are removed, for example, using a selective etching process, to expose surfaces of the well contact regions 188. The surfaces of the well contact regions 188 may thereby be recessed to define a step difference d 126 (i.e., in a vertical direction) relative to surfaces of the source regions 160 having the first ohmic contacts 190 thereon. The step difference may be greater than about 10 nanometers (nm) and less than about 100 nm, e.g., between about 15 nm and 50 nm. In some embodiments, the material of the blocking regions 187' may have etch selectivity with respect to the materials of the ILD layer(s) 186, such that removal of the blocking regions 187' may not substantially etch the ILD layer(s) 186. In some embodiments, the material of the blocking regions 187' may not have etch selectivity with respect to the materials of the ILD layer(s) 186, but may be relatively thin such that etching of the ILD layer(s) 186 during removal of the blocking regions 187' may not be functionally significant.

As shown in FIG. 18, one or more second metals (e.g., Ni, Ti, and/or Al), which may be different than the first metals or compounds for the ohmic contacts 190, is deposited in the contact opening 196*op* and reacted with the recessed surfaces of the well contact regions 188 to form the second ohmic contacts 195 of a second metal silicide (e.g., NiAlSi). For example, one or more annealing (e.g., RTA) processes and/or etching processes are performed to silicide the second metal(s) and form the second ohmic contacts 195 of the second metal silicide on the well contact regions 188. The first ohmic contacts 190 may be masked or otherwise protected prior to deposition of the second metal(s) for forming the second ohmic contacts 195. The second metal silicide for the second ohmic contacts 195 may thus be different than and selected independent of the metal silicides for the first ohmic contacts 190. The annealing process(es) may likewise be independently performed at a desired, lower temperature (e.g., 400 degrees to 600 degrees C., for example, 500 degrees C.) to form the second metal silicide for the second ohmic contacts 195. Again, because the contacts 190 were formed and optimized in previous processes, the metal(s), temperature(s) and/or other fabrication conditions of FIG. 18 can be independently selected so as to optimize resistance, current distribution, and/or other characteristics of the second ohmic contacts 195.

In some embodiments, the gates 184 may be polysilicon, and prior to formation of the ILD layer(s) 186, one or more metals (e.g., Ta) may be deposited on and reacted with the gates 184 (e.g., using a high-temperature silicide process) to form the gate contacts 185 of a high-temperature metal silicide (e.g., TaSi). For example, the gate contacts 184 may be formed before formation of the first and second ohmic contacts 190 and 195. In some embodiments, the high-temperature silicide process may be used to silicide up to an entirety of the polysilicon layer. However, the low-temperature gate metal silicide process discussed above with reference to FIG. 6 (e.g., using Ti or Co) may not be implemented when the separate silicide modules for n-type and p-type ohmic contact formation are performed after deposition of the ILD layer(s) 186, as the higher annealing temperatures used to subsequently form the first ohmic contacts 190 on the source regions 160 may cause migration, agglomeration, and/or other degradation in characteristics of the previously-formed gate contacts 185.

Figure 19:
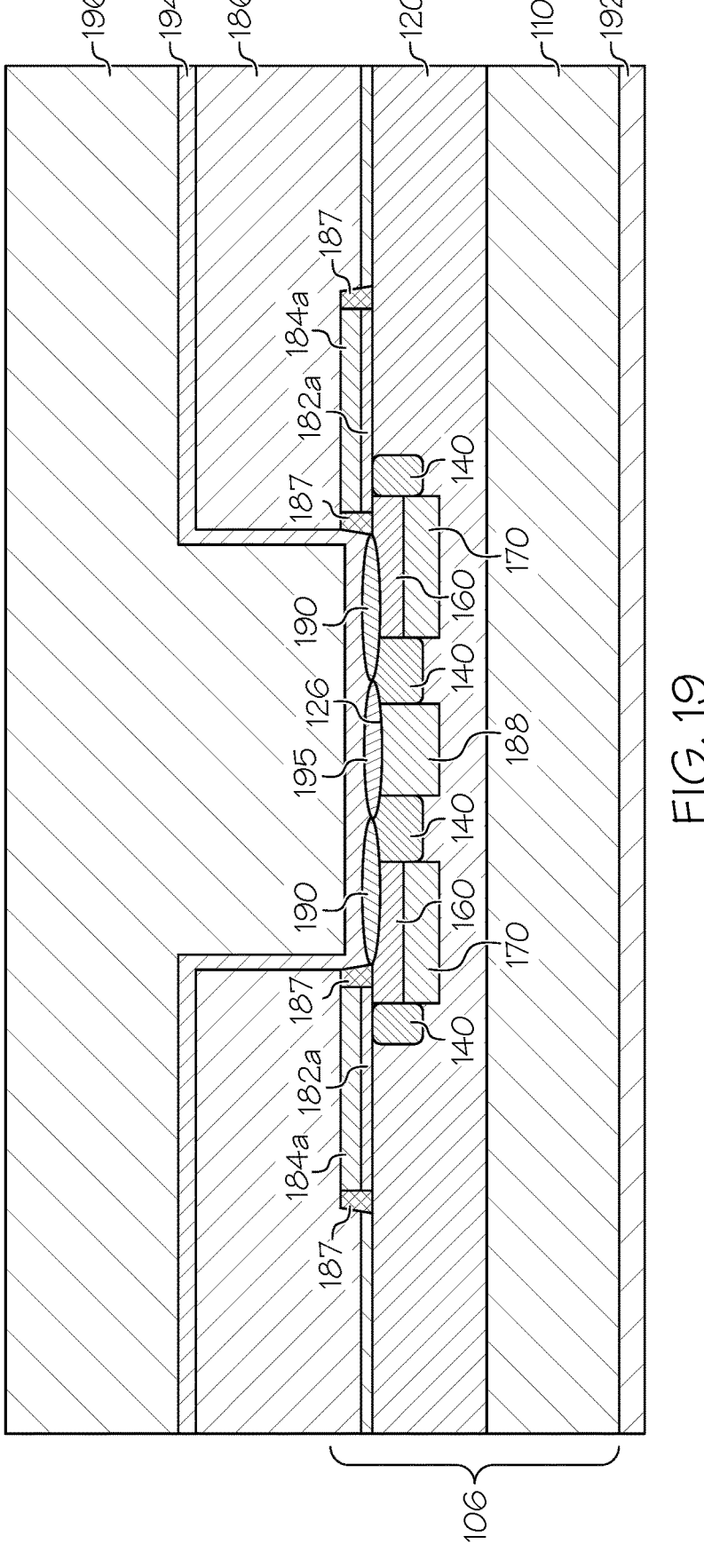

FIG. 19 illustrates barrier and contact metal deposition in the contact opening 196*op*. As shown in FIG. 19, one or more barrier metal layers 194 (e.g., Ti, Al, or TiN) may be conformally formed in the contact opening 196*op* and on surfaces of the ILD layer(s) 186 outside the contact opening 196*op*. One or more contact metal layer(s) 196 (e.g., Al, Ti, tantalum (Ta), or tungsten (W)) are formed on the barrier metal layer(s) 194 to substantially fill the contact opening 196*op*. Due to formation of the ILD layer(s) 186 prior to the ohmic contacts 190 and/or 195, the contact metal layer(s) 196 may be formed directly on an entirety of the ohmic contacts 190 and 195. The drain contact 192 is also formed (e.g., on a surface of the substrate 110 opposite to the drift region 120), thereby completing the device.

Embodiments of the present invention may thereby provide power semiconductor devices including contacts 185, 190, and/or 195 with independently optimizable characteristics. For example, while respective contact resistances of the n-type and/or p-type ohmic contacts may be compromised (e.g., with a higher than desired resistance) in some conventional devices due to the use of the same metal(s) and/or annealing temperatures, embodiments of the present invention may allow for forming the first and second ohmic contacts 190 and 195 with independently optimized contact resistances. For example, the respective contact resistances of the ohmic contacts 190 and 195 may be reduced to less than about $1 \times 10^{-3}$ ohm-cm$^2$, e.g., less than about $1 \times 10^{-4}$ ohm-cm$^2$ but greater than about $5 \times 10^{-7}$ ohm-cm$^2$. In some embodiments, a contact resistance of the first ohmic contacts 190 may be less than about $4 \times 10^{-5}$ ohm-cm$^2$ (e.g., less than about $1 \times 10^{-5}$ ohm-cm$^2$ but greater than about $5 \times 10^{-7}$ ohm-cm, for example, about $1 \times 10^{-6}$ ohm-cm$^2$), and the contact resistance of the second ohmic contacts 195 may be less than about $5 \times 10^{-3}$ ohm-cm$^2$ (e.g., less than about $1 \times 10^{-3}$ ohm-cm$^2$ but greater than about $5 \times 10^{-7}$ ohm-cm, for example, about $1 \times 10^{-4}$ ohm-cm$^2$). In some embodiments, the contact resistance of the ohmic contacts 190 or 195 may be more than an order of magnitude less than that of some conventional n-type or p-type ohmic contacts, respectively. In some embodiments, the contact resistance of the gate contacts 185 may be less than about $1\times10^{-3}$ ohm-cm$^2$ but greater than about $5\times10^{-7}$ ohm-cm, for example, about $1\times10^{-4}$ ohm-cm$^2$ to about $1\times10^{-6}$ ohm-cm$^2$.

Accordingly, power semiconductor devices including n-type ohmic contacts, p-type ohmic contacts, and/or gate contacts of different silicide materials and/or independent fabrication processes in accordance with embodiments of the present invention may provide several advantages over contact configurations and fabrication methods of existing power semiconductor devices. For example, optimized n-type ohmic contacts, p-type ohmic contacts, and/or gate contacts as described herein may allow MOSFETs and other transistor structures with faster switching speeds and more uniform current distribution (i.e., due to more of the transistor cells being switched on within a desired switching timeframe). More uniform current distribution may also provide less local transistor cell aging (due to reduction of hot spots) and thus overall longer device lifetime. Embodiments of the present invention may be used in power devices, including vertical or lateral power devices, with n-type and p-type contacts to SiC or other wide bandgap semiconductor contact regions, with or without a polysilicon gate.

It will be appreciated that features of the different embodiments disclosed herein may be combined in any way to provide many additional embodiments. Also, while the present invention is described above primarily with respect to power MOSFET implementations, it will be appreciated that the techniques described herein apply equally well to other similar power semiconductor devices. Thus, embodiments of the present invention are not limited MOSFETs, and the techniques disclosed herein may be used on IGBTs or any other appropriate device. For example, features of any MOSFET embodiment described herein may be incorporated into IGBT embodiments fabricated on SiC, or other semiconductor materials, for example, Si. Thus, it will be appreciated that various features of the inventive concepts are described herein with respect to specific examples, but that these features may be added to other embodiments and/or used in place of example features of other embodiments to provide many additional embodiments. The present invention should therefore be understood to encompass these different combinations.

In the description above, each example embodiment is described with reference to regions of particular conductivity types. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide bandgap semiconductor material system. As an example, gallium nitride based semiconductor materials (e.g., gallium nitride, aluminum gallium nitride, etc.) may be used instead of silicon carbide in any of the embodiments described above. More generally, while discussed with reference to silicon carbide devices, embodiments of the present invention are not so limited, and may have applicability to devices formed using other wide bandgap semiconductor materials, for example, gallium nitride, zinc selenide, or any other II-VI or III-V wide bandgap compound semiconductor materials.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

Herein, a first element (e.g., a contact, layer or region) of a semiconductor device "vertically overlaps" a second element of the semiconductor device if an axis that is perpendicular to a surface of the semiconductor layer structure of the device (e.g., in a vertical direction) extends through both the first element and the second element.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to fabrication operations. It will be appreciated that the steps shown in the fabrication operations need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("—") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A power semiconductor device, comprising:
a semiconductor layer structure comprising a drift region of a first conductivity type, a source region of the first conductivity type, and a well contact region of a second conductivity type;
a first ohmic contact comprising a first conductive material on the source region;
a second ohmic contact that is distinct from the first ohmic contact, the second ohmic contact comprising a second conductive material on the well contact region, wherein the second conductive material is different than the first conductive material;
at least one contact plug that is on the first and/or second ohmic contacts, wherein the at least one contact plug electrically connects the first and second ohmic contacts; and
a gate structure comprising a gate contact comprising a third conductive material, wherein the third conductive material is different than the first and second conductive materials.

2. The power semiconductor device of claim 1, further comprising:
a dielectric layer on a surface of the semiconductor layer structure,
wherein the dielectric layer laterally extends onto an upper surface of an edge of the first ohmic contact.

3. The power semiconductor device of claim 1, wherein a surface of the well contact region comprises a step difference relative to a surface of the source region.

4. The power semiconductor device of claim 3, wherein the step difference is greater than about 10 nanometers (nm) and less than about 100 nm.

5. The power semiconductor device of claim 1, wherein a first contact resistance of the first ohmic contact and a second contact resistance of the second ohmic contact are less than about $1 \times 10^{-3}$ ohm-cm$^2$.

6. The power semiconductor device of claim 5, wherein the first contact resistance is about $1 \times 10^{-6}$ ohm-cm$^2$ to about $5 \times 10^{-7}$ ohm-cm$^2$, and wherein the second contact resistance is about $1 \times 10^{-4}$ ohm-cm$^2$ to about $5 \times 10^{-7}$ ohm-cm$^2$.

7. The power semiconductor device of claim 1, wherein the semiconductor layer structure comprises silicon carbide, and wherein the first, second, and third conductive materials comprise first, second, and third metal silicides, respectively.

8. The power semiconductor device of claim 1, wherein the first and second ohmic contacts comprise at least one dimension that is about 2 micrometers (μm) to about 1 μm.

9. The power semiconductor device of claim 1, further comprising:
a protective spacer that is directly on the semiconductor layer structure and extends along a sidewall of the gate structure.

10. A power semiconductor device, comprising:
a semiconductor layer structure comprising a drift region of a first conductivity type, a source region of the first conductivity type, and a well contact region of a second conductivity type, wherein the semiconductor layer structure comprises silicon carbide;
a first ohmic contact comprising a first conductive silicide on the source region;
a second ohmic contact comprising a second conductive silicide on the well contact region, wherein the second conductive silicide is different than the first conductive silicide; and
a gate structure comprising a gate contact comprising a third conductive silicide, wherein the third conductive silicide is different than the first and second conductive silicides,
wherein the first conductive silicide comprises nickel, wherein the second conductive silicide comprises at least one of nickel, aluminum, or titanium, and wherein the third conductive silicide comprises at least one of tantalum, tungsten, titanium, or cobalt.

11. A power semiconductor device, comprising:
a semiconductor layer structure comprising a drift region of a first conductivity type, a source region of the first conductivity type, and a well contact region of a second conductivity type adjacent the source region;
a first ohmic contact comprising a first conductive material on the source region;
a second ohmic contact that is distinct from the first ohmic contact, the second ohmic contact comprising a second conductive material on the well contact region, wherein the second conductive material is different than the first conductive material; and
at least one contact plug that is on the first and/or second ohmic contacts, wherein the at least one contact plug electrically connects the first and second ohmic contacts,
wherein, in plan view, the first and second ohmic contacts comprise at least one dimension that is less than about 2 micrometers (μm).

12. The power semiconductor device of claim 11, wherein the semiconductor layer structure comprises silicon carbide, and wherein the first and second conductive materials comprise first and second metal silicides, respectively.

13. The power semiconductor device of claim 12, further comprising:
a gate structure on the drift region adjacent the source region;
a protective spacer on a sidewall of the gate structure; and
a gate contact on the gate structure, wherein the gate contact comprises a third metal silicide that is different from the first and second metal silicides.

14. The power semiconductor device of claim 11, wherein a first contact resistance of the first ohmic contact and a second contact resistance of the second ohmic contact are less than about $1 \times 10^{-3}$ ohm-cm$^2$ and greater than about $5 \times 10^{-7}$ ohm-cm$^2$.

15. The power semiconductor device of claim 11, wherein the at least one dimension of the first and second contacts is greater than about 1 μm.

16. A power semiconductor device, comprising:

a semiconductor layer structure comprising a drift region of a first conductivity type, a source region of the first conductivity type, and a well contact region of a second conductivity type adjacent the source region;

a first ohmic contact comprising a first conductive material on the source region;

a second ohmic contact comprising a second conductive material on the well contact region, wherein the second conductive material is different than the first conductive material; and a dielectric layer on a surface of the semiconductor layer structure, wherein the dielectric layer laterally extends onto an upper surface of an edge of the first ohmic contact.

17. The power semiconductor device of claim 16, wherein the semiconductor layer structure comprises silicon carbide, and wherein the first and second conductive materials comprise first and second metal silicides, respectively.

18. The power semiconductor device of claim 17, further comprising:

a gate structure on the drift region adjacent the source region;

a protective spacer on a sidewall of the gate structure; and a gate contact on the gate structure, wherein the gate contact comprises a third metal silicide that is different from the first and second metal silicides.

19. The power semiconductor device of claim 18, wherein the third metal silicide has a lower silicidation temperature than the first metal silicide.

20. A power semiconductor device, comprising:

a semiconductor layer structure comprising a drift region of a first conductivity type, a source region of the first conductivity type, and a well contact region of a second conductivity type adjacent the source region;

a first ohmic contact comprising a first conductive material on the source region; and a second ohmic contact comprising a second conductive material on the well contact region, wherein the first and second ohmic contacts are on first and second portions of a surface of the semiconductor layer structure, respectively, and wherein the second portion of the surface comprises a step difference relative to the first portion of the surface.

21. The power semiconductor device of claim 20, wherein the semiconductor layer structure comprises silicon carbide, and wherein the first and second conductive materials are different and comprise first and second metal silicides, respectively.

22. The power semiconductor device of claim 21, further comprising:

a gate structure on the drift region adjacent the source region;

a protective spacer on a sidewall of the gate structure; and a gate contact on the gate structure, wherein the gate contact comprises a third metal silicide that is different from the first and second metal silicides.

23. The power semiconductor device of claim 22, wherein the third metal silicide has a higher silicidation temperature than the first or second metal silicide.

24. A power semiconductor device, comprising:

a semiconductor layer structure comprising a drift region of a first conductivity type, a source region of the first conductivity type, and a well contact region of a second conductivity type adjacent the source region;

a first ohmic contact comprising a first conductive material on the source region; and a second ohmic contact that is distinct from the first ohmic contact, the second ohmic contact comprising a second conductive material on the well contact region, wherein the second conductive material has a different annealing temperature than the first conductive material; and at least one contact plug that is on the first and/or second ohmic contacts, wherein a first contact resistance of the first ohmic contact and a second contact resistance of the second ohmic contact are less than about $1 \times 10^{-3}$ ohm-cm$^2$.

25. The power semiconductor device of claim 24, wherein the first contact resistance is about $1 \times 10^{-6}$ ohm-cm$^2$ to about $5 \times 10^{-7}$ ohm-cm$^2$, and wherein the second contact resistance is about $1 \times 10^{-4}$ ohm-cm$^2$ to about $5 \times 10^{-7}$ ohm-cm$^2$.

26. The power semiconductor device of claim 25, wherein the semiconductor layer structure comprises silicon carbide, and wherein the first and second conductive materials comprise first and second metal silicides, respectively.

27. The power semiconductor device of claim 26, further comprising:

a gate structure on the drift region adjacent the source region; and a gate contact on the gate structure, wherein the gate contact comprises a third metal silicide that is different from the first and second metal silicides, and wherein the gate contact has a third contact resistance of about $1 \times 10^{-3}$ ohm-cm$^2$ to about $5 \times 10^{-7}$ ohm-cm$^2$.

28. The power semiconductor device of claim 24, wherein the at least one contact plug electrically connects the first and second ohmic contacts.

* * * * *